(12) United States Patent
Vetter

(10) Patent No.: US 11,942,311 B2
(45) Date of Patent: Mar. 26, 2024

(54) MAGNET ARRANGEMENT FOR A PLASMA SOURCE FOR PERFORMING PLASMA TREATMENTS

(71) Applicant: OERLIKON SURFACE SOLUTIONS AG, PFÄFFIKON, Pfäffikon (CH)

(72) Inventor: Jörg Vetter, Bergisch Gladbach (DE)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 0 days.

(21) Appl. No.: 17/416,001

(22) PCT Filed: Dec. 5, 2019

(86) PCT No.: PCT/EP2019/083898
§ 371 (c)(1),
(2) Date: Jun. 18, 2021

(87) PCT Pub. No.: WO2020/126531
PCT Pub. Date: Jun. 25, 2020

(65) Prior Publication Data
US 2022/0051882 A1  Feb. 17, 2022

Related U.S. Application Data

(60) Provisional application No. 62/783,387, filed on Dec. 21, 2018.

(30) Foreign Application Priority Data

Feb. 26, 2019  (CH) .......................... 236/19

(51) Int. Cl.
*H01J 37/32* (2006.01)
*C23C 14/32* (2006.01)
*H01J 37/34* (2006.01)

(52) U.S. Cl.
CPC ...... *H01J 37/32669* (2013.01); *C23C 14/325* (2013.01); *H01J 37/32055* (2013.01);
(Continued)

(58) Field of Classification Search
None
See application file for complete search history.

(56) References Cited

U.S. PATENT DOCUMENTS 5,106,474 A * 4/1992 Dickey ............... H01J 37/3438
 204/298.22
5,294,322 A * 3/1994 Vetter ................. C23C 14/022
 204/298.41

(Continued)

FOREIGN PATENT DOCUMENTS

CN   1802729   7/2006
DE  41 25 365   5/1992
(Continued)

OTHER PUBLICATIONS

Int'l Search Report (Form PCT/ISA/210) conducted in Int'l Application No. PCT/EP2019/083898 (dated Feb. 11, 2020).

(Continued)

*Primary Examiner* — Jason Berman
(74) *Attorney, Agent, or Firm* — GREENBLUM & BERNSTEIN, P.L.C.

(57) ABSTRACT

In order to improve the etching depth and/or the etching homogeneity at a substrate, a plasma source with one or more single electrodes or one or more magnets is proposed. The magnet generates a magnetic field in the vicinity of the electrodes, which may be rear-side or front-side.

18 Claims, 13 Drawing Sheets

(52) U.S. Cl.
CPC .. *H01J 37/32568* (2013.01); *H01J 37/32651* (2013.01); *H01J 37/34* (2013.01)

(56) References Cited

U.S. PATENT DOCUMENTS

| | | | |
|---|---|---|---|
| 2004/0055538 | A1 | 3/2004 | Gorokhovsky |
| 2004/0154919 | A1* | 8/2004 | Curtins ................ C23C 14/325 204/298.41 |
| 2007/0000772 | A1 | 1/2007 | Ramm et al. |
| 2008/0173536 | A1 | 7/2008 | Ramm et al. |
| 2008/0193782 | A1 | 8/2008 | Ramm et al. |
| 2014/0246325 | A1 | 9/2014 | Tsuchiya et al. |

FOREIGN PATENT DOCUMENTS

| | | |
|---|---|---|
| DE | 10 2009 008 161 | 8/2010 |
| EP | 0554552 | 8/1993 |
| EP | 2 778 253 | 9/2014 |
| EP | 2 787 795 | 10/2014 |
| JP | 2003-3251 | 1/2003 |
| JP | 2013-129874 | 7/2013 |
| JP | 2016-509333 | 3/2016 |
| WO | 2006/099758 | 9/2006 |
| WO | 2016/017438 | 2/2016 |

OTHER PUBLICATIONS

Int'l Written Opinion (Form PCT/ISA/237) conducted in Int'l Application No. PCT/EP2019/083898 (dated Feb. 11, 2020).
Japan Search Report/Office Action conducted in counterpart Japan Appln. No. 2021-535668 (dated Nov. 29, 2023).
China Search Report/Office Action conducted in counterpart China Appln. No. 201980091446.0 (dated Nov. 30, 2023).

* cited by examiner

- Parameter
  HSS samples, 2-times rotated
  $I_{evap}$: 85 A, p=1 Pa, $I_{electrode}$: 80 A, $U_{su}$=200 V, puls 20 kHz, 80% on,
  Time: 1h, planetar: substrate; electrode=evaporator Cr
- $U_{electrode}$: X, $I_{su}$: X

|  | Depth top (nm) | Depth mid (nm) | Depth bot (nm) | $I_{su}$ (A) | $U_{electrode}$ (V) | Electrode Current (A) | Total Electr. (kW) |
|---|---|---|---|---|---|---|---|
| Stand. | 110 48% | 210 84% | 250 100% | 1,9 | 31 | 80 A | 2,48 |
| A+B only on the back | 180 43% | 350 83% | 420 100% | 3,4 | 31 | A40/B40 | 2,48 |
| Bact. Same pol. Coil 3A | 760 100% | 620 86% | 300 39% | 4,5 | 36 | A75/B5 | 2,88 |
| Bact. Reversed pol. Coil 3A | 240 38% | 490 76% | 640 100% | 4 | 32 | A49/B31 | 2,56 |

MAGNET ARRANGEMENT FOR A PLASMA SOURCE FOR PERFORMING PLASMA TREATMENTS

TECHNICAL FIELD

The present invention relates generally to a plasma source and specifically to a plasma source comprising a magnet arrangement.

BACKGROUND

On the one hand, electric glow discharge, which is formed by the passage of a current through a gas by applying a sufficiently high voltage between a cathode and an anode, such as argon or another noble gas at defined low pressures, can be used for plasma generation. On the other hand, the plasma generation of a gas or gas mixture in the form of a low-pressure plasma can be achieved by the interaction of high-energy electrons with gases, which are provided by an electron source and accelerated to defined energies by suitable electrodes. Such an electron source can be, for example, a cathodic vacuum arc evaporator consisting of a suitably shielded arc cathode and an arc anode receiving the arc electrons. For gas plasma generation, these arc electrons are extracted with suitable electrodes and accelerated at high energy. The gas plasma generated in this way can be used for various plasma treatments of substrates. For example, inert gas ions (e.g., argon ions) generated in this way serve for an ion cleaning of the substrates. Chemical compounds excited in the plasma and, if necessary, decomposed, as well as atomized molecules of the gases and gas mixtures, can be used for thermochemical treatment of substrates or even for coating deposition. It is important to adjust the local plasma generation in a defined manner with regard to the treatment objectives with suitable electrodes in terms of form, arrangement and operating parameters. One objective is to design the electrodes in such a way that they do not protrude into the treatment room in a disturbing manner and that they can be applied with high power densities and that they are as easy to maintain as possible. Furthermore, the objective of the invention is to form the plasma at the electrodes generating the gas plasma to be adjustable in time and place by means of suitable magnetic fields at least at one electrode introduced into the treatment chamber, whereby the local and temporal plasma distribution in the treatment chamber can be adjusted.

DESCRIPTION OF THE PRESENT INVENTION

The invention relates to a vacuum chamber for performing a plasma treatment comprising a plasma treatment area which is enclosed by chamber walls of the vacuum chamber, and a plasma source. Here, the plasma source comprises at least one cathode arranged in the vacuum chamber for cathodic vacuum arc evaporation with an arc anode which is connected to the vacuum chamber and at least one electrode arranged in the vacuum chamber. A shield may be arranged in front of the cathode and the electrode has a working surface for collecting the electrons emitted from the cathode, characterized in that the working surface is a two-dimensional surface for collecting the electrons emitted from the cathode. The two-dimensional surface has a first orthogonal extension and a second orthogonal extension to a surface normal, wherein the first orthogonal extension is perpendicular to the second orthogonal extension, and a length ratio of the first orthogonal extension to the second orthogonal extension is between 0.1 and 1. A magnet for generating a magnetic field acting on the working surface of the electrode is arranged in, on or in and on the vacuum chamber.

Generally, the magnet may comprise a front-side magnet and/or a rear-side magnet. The front-side magnet is arranged in the area of the working surface for generating a front-side magnetic field and the rear-side magnet is arranged behind the working surface for generating a rear-side magnetic field. The magnet according to the invention can be designed as a magnetic circuit, i.e., as a coil or a plurality of magnets. The magnetic circuit encloses the working surface or is arranged in front of the working surface. Particularly preferably, an electrode according to the invention comprises an entire magnetic system comprising a front-side magnetic circuit and a rear-side magnetic circuit.

In an embodiment of the invention, any number of electrodes and cathodes may be arranged in the vacuum chamber. In this case, a magnet can be arranged at each electrode or only at a subset of a plurality of electrodes. Here, rear-side and/or front-side magnets can be arranged at the electrodes.

According to the invention, at least one magnet for generating a magnetic field is arranged on the electrode in the vacuum chamber. Here, a first electrode and a second electrode can be present. Here, the first electrode may be affected by a first front-side magnetic field and the second electrode may be affected by a second front-side magnetic field. In an embodiment of the invention, it is also conceivable that the first electrode has a first rear-side magnetic field, and the second electrode has a second rear-side magnetic field. In the case of multiple electrodes, one part of the electrodes (or a first electrode) may have a rear-side magnetic field, while another part of the electrodes (or a second electrode) has a front-side magnetic field. If several electrodes are present, these can preferably be connected to a common power supply or can of course also be connected to different power supplies (current sources). A magnet on a vacuum chamber according to the invention can comprise a permanent magnet system and/or an electromagnet. If the magnet comprises an electromagnet, the electromagnet can be designed as an electromagnetic coil coupled to the electrode. If a plurality of electrodes is present, any number of the electrodes can have an adjustable magnetic field. Adjustable magnetic fields according to the invention can be adjustable by, inter alia, different currents, a specific magnet arrangement, and different polarities. If several magnets are present, the polarities of the magnets, in particular of the rear-side or front-side magnet, can be reversible. The electrode according to the invention can in particular be an evaporator, which comprises at least one metal. All the measures described above can be used, inter alia, to adjust and influence the homogeneity of the plasma. This is because the discharge can be additionally changed at one or more electrodes by a magnetic field. Here, by operating multiple electrodes each with a single power supply, homogeneity can be controlled while maintaining stronger plasma excitation by predetermining and adjusting current values. By adjusting the homogeneity of the plasma and consequently by the magnetic fields according to the invention, for example, the etching rate and etching homogeneity can also be adjusted. In particular, an etching profile can also be influenced by controlling coils and/or by the arrangement of the magnets.

Typical industrial cathodic vacuum arc evaporators can be used as electron sources. In front of a cathodic vacuum arc evaporator (later also simply arc evaporator), which is used as an electron source, a shield can be provided, which is designed in such a way that it withstands the heat input from the vacuum arc evaporation. The dimensioning of one area of such a shield should be larger than the whole area of the cathodic vacuum arc evaporator, which comprises a surface to be evaporated, in order to avoid a vaporization of the substrates.

One or more electron-collecting electrodes could be used in the form of uncooled electrodes. However, the use of uncooled electrodes may lead to a limitation of the power that can be applied to the electrodes. For this reason, cooled electrodes, for example water-cooled electrodes, are advantageously used.

One or more typical (arc) power supplies that can provide a voltage of up to 100V and a current of up to 400 A, can be used as the power supply for the electrodes. Here, with an appropriate dimensioning of the working surface and operating mode, current densities between 0.1 to 5 A/cm$^2$ and power densities between 0.25 to 500 W/cm$^2$ can be achieved at the electrodes.

A total gas pressure in the range of 0.01 Pa to 5 Pa should be maintained in the chamber during the plasma treatment, preferably a gas pressure in the range of 0.1 Pa to 2 Pa. Typical gases are argon, hydrogen, nitrogen or hydrocarbon gases (e.g., $C_2H_2$, acetylene), which are used as pure gases or gas mixtures depending on the treatment objective.

The vacuum chamber according to the invention can comprise both the plurality of electrodes and the plurality of cathodes, in particular cathodic vacuum arc evaporators. Here, several cathodes may have a single shield or several shields. Several cathodes, in particular cathodic vacuum arc evaporators, with the one shield can be advantageously arranged with at least one electrode in the vacuum chamber. In particular, the vacuum chamber may also comprise an equal number of electrodes and cathodes (in particular cathodic vacuum arc evaporators), more electrodes than cathodes (in particular cathodic vacuum arc evaporators), or more cathodes (in particular cathodic vacuum arc evaporators) than electrodes. Here, the electrodes and cathodes can be arranged at different locations in the vacuum chamber (walls, ceiling, floor). The plasma distribution in the vacuum chamber can be adjusted both via the arrangement and the number of electrodes and cathodes (in particular cathodic vacuum arc evaporators). In addition, for example, an improvement of the etching depth and/or the etching homogeneity on a substrate can be achieved in an ion etching process. The use of more than one electrode allows the use of different currents on the electrodes as well as a time selective application of the currents so that an improved control of plasma generation is enabled.

The electron current at the electrode can be adjusted by adjusting the electrode voltage. Low electrode voltages result in a low electron current and a low plasma activity.

A typical maximum electron current at the one or more electrodes should be selected at approximately 120% of the current of the cathodic vacuum arc evaporator. For example: If a cathodic vacuum arc evaporator is used as the electron source in a vacuum chamber containing argon at an argon pressure of 0.5 Pa, with the cathodic vacuum arc evaporator being operated at an arc current of 100 A, the total electrode current should be adjusted to approximately 120 A. This means that the current at the one electrode, or if more than one electrode is used, the sum of the individual currents at the individual electrodes, should be adjusted to a maximum of 120 A. An electrode current that is less than or equal to the arc current is preferred.

When a plurality of electrodes (more than one electrode) is arranged along a chamber wall in such a way that they are distributed over the height of the vacuum chamber, each electrode can be operated on a separate power supply or on a specific group of power supplies so that the electrodes can be switched to operate them at a maximum current or to operate them in parallel at a maximum current by applying different voltages to the different electrodes. Typical values of electrode voltage are in the range of 10 V-50 V and typical electrode currents are in the range of 10 A-200 A.

In addition, the present invention can be used for performing coating processes, for example, for depositing diamond-like carbon (DLC) coatings. In the case that a-C:H type DLC layer is to be deposited, a mixture of an acetylene ($C_2H_2$) gas flow and an argon gas flow should be supplied to the chamber.

Virtually any coating device designed to perform vacuum coating processes, such as PVD arc evaporation processes or PVD sputtering processes, including HiPIMS, or plasma enhanced chemical vapor deposition (PA-CVD) processes, can be adapted to perform plasma treatment processes according to the present invention.

In the arrangement according to the invention, the magnet for generating a magnetic field is to be arranged in the chamber at the electrode. The magnet can be the front-side magnet, which can be controlled manually so that its magnetic field can be changed. However, the front-side magnet could also be a permanent magnet.

In the arrangement according to the invention, the electron accelerating electrode is not spatially linear in the sense of a relationship between the length of the electrode and the cross sections, which are often rectangular or circular or elliptical. Substantially, two-dimensional electrodes are used. This means that the two-dimensional surface has the first orthogonal extension and the second orthogonal extension to the surface normal, wherein the first orthogonal extension is perpendicular to the second orthogonal extension. The length ratio of the first orthogonal extension to the second orthogonal extension is between 0.1 and 1. The length ratio of the first orthogonal extension to the second orthogonal extension can also be between 0.2 and 1, in particular between 0.4 and 1, especially at 1. The working surface can be in the range of 5 to 2000 cm$^2$, in particular 25 to 320 cm$^2$. The two-dimensional surface can be circular, ellipsoidal but also rectangular or have other suitable shapes. If the two-dimensional surface is circular, the first orthogonal extension and the second orthogonal extension correspond in particular to the diameter of the two-dimensional surface. If the two-dimensional surface is rectangular, the first orthogonal extension corresponds to a first edge length and the second orthogonal extension corresponds to a second edge length of the two-dimensional surface. If the two-dimensional surface is ellipsoidal, the first orthogonal extension and the second orthogonal extension correspond in particular to distances from opposite vertices of the two-dimensional surface. The term two-dimensional also refers, inter glia, to the fact that the electrons strike a substantially planar surface. However, the surface itself may have a certain structure due to its manufacture or use. This structuring can occur due to erosion of the electrode when used as a coating source or by cleaning the electrode via, for example, blasting or grinding. The electrode can be eroded due to erosion in such a way that it no longer has a smooth or regular structure/edge. Such structured and eroded electrodes are also considered substantially planar within the framework of the invention. The ratio between a maximum depth of the structuring and the smaller orthogonal extension (with respect to the first orthogonal extension or second orthogonal extension according to the invention) of the two-dimensional surface of the electrode is at most 0.4, in particular at most 0.3, especially at most 0.2. Thus, the maximum depth of the structuring should always be smaller than the smaller orthogonal extension. In this case, the two-dimensional surface of the electrode preferably has active magnetic fields.

In the simplest case, a circular electrode is operated, which preferably has an electrode diameter of 100 mm. In this case, the electrode can be attached to a wall of the vacuum chamber and can also be arranged at least partially in the chamber wall. If the electrode is at least partially arranged in the chamber wall, this has the distinct advantage that the electrode does not protrude significantly into the coating chamber. If, as described above, several two-dimensional electrodes are present, the electrodes may be attached to different chamber walls. For example, if two two-dimensional electrodes are installed, the two two-dimensional electrodes are preferably arranged on opposite chamber walls. Of course, there is also the possibility that several two-dimensional electrodes are arranged on adjacent and/or several two-dimensional electrodes on the same chamber wall. In this case, a first and a second electrode preferably have a distance of 20 to 400 mm, in particular 100 to 300 mm, especially 200 mm, when they are operated on a chamber wall one above the other or side by side.

The arrangement of the two-dimensional electrode on a chamber wall has in particular the following advantages compared to the state of the art with a linear electrode inside the vacuum chamber. The plasma treatment area inside the vacuum chamber, in particular in the center of the vacuum chamber, provides more free space. Due to this free space, a better use of the chamber can thus be achieved. For a better use of the chamber, the substrates to be treated can be better distributed within the vacuum chamber because there is more space in the chamber to distribute the substrates to be treated due to the free space created. In this way, a homogeneous plasma treatment of the substrate surfaces can also be made possible, in particular if the substrates to be treated can be arranged more uniformly in the chamber. It is a further advantage of the arrangement according to the invention that a simple cooling of these electrodes according to the invention is made possible. A two-dimensional surface such as is present in the electrodes according to the invention is, of course, much easier and more effective to cool than would be possible in the case of a linear electrode. The cooling of the electron-receiving surface can be direct (water flow) or indirect. Indirect is the clamping of a suitable electrode material on a cooling body.

The material of the cathode of the electron source on the basis of a cathodic vacuum arc evaporator (later also simply designated as evaporator), may preferably be a metal, in particular titanium (Ti), zirconium (Zr) or aluminum (Al). Of course, the material of the cathode can also consist of another suitable element, another suitable alloy or (titanium alloy and/or zirconium alloy and/or aluminum as well as aluminum alloys) or another suitable metal, which favors an adsorption of hydrogen and/or oxygen. Due to such characteristics of the cathode of the vacuum arc evaporator, inter alia, a better vacuum quality can also be achieved for performing the plasma processes. All possible target materials of cathodic vacuum arc evaporators known from the state of the art are suitable as electrode materials. Inter alia, carbon targets made of pure carbon or alloys such as copper-carbon alloys can be used as electrode materials. Steel, copper, copper alloys, aluminum, aluminum alloys, or conductive evaporator materials such as aluminum titanium, chromium, or vanadium are also suitable as electrode materials.

In an embodiment of the invention, a plurality of electrodes may be arranged in the vacuum chamber. Here, each electrode preferably comprises a working surface according to the invention. If a first and a second electrode are present in the vacuum chamber, a second front-side magnet may be arranged in front of a second working surface of the second electrode. The second front-side magnet may also be arranged at least partially next to or around the second working surface. Furthermore, the first front-side magnet may be arranged in front of the first working surface and/or the first front-side magnet may be arranged at least partially next to or around the first working surface.

A polarity of the magnet according to the invention or the magnetic circuit can be adjusted as desired. In this case, the front-side and the rear-side magnet (or magnetic circuits) can have the same or reversed polarity. With the plurality of electrodes, the first front-side magnet may have the same polarity as the second front-side magnet. In addition, it is possible that a first polarity of the first front-side magnet is reverse to a second polarity of the second front-side magnet. The same applies to the rear-side magnets. In particular, the magnets can have a changeable polarity.

In practice, the first electrode and the second electrode can be connected to a common power supply, or the first electrode can be connected to a first power supply and the second electrode to a second power supply. In particular, the plurality of electrodes may comprise a first group of electrodes which is connected to a first power supply and comprise a second group of electrodes which is connected to a second power supply. When the first electrode and the second electrode are connected to the common power supply, the changeable polarity of the first front-side magnet and/or the second front-side magnet can be adjusted by reversing or regulating a current applied to the first magnet and/or the second magnet, respectively.

BRIEF DESCRIPTION OF THE DRAWINGS

The same reference signs designate the same elements, features and structures in all drawings and throughout the description, except where otherwise described. The relative size and representation of these elements may, for reasons of clarity, illustration or expediency, be out of scale.

FIG. 2 *a* shows a schematic representation of a vacuum chamber according to the invention for performing a plasma treatment with a rectangular electrode according to a further embodiment.

FIG. 2 *b* shows a schematic representation of a vacuum chamber according to the invention for performing a plasma treatment with an electrode with a switch between electrode and power supply according to a further embodiment.

FIG. 2 *c* shows a schematic representation of a vacuum chamber according to the invention for performing a plasma treatment with an electrode with a switch for reversing the polarity of a power supply according to a further embodiment.

DETAILED DESCRIPTION

Figure 1:
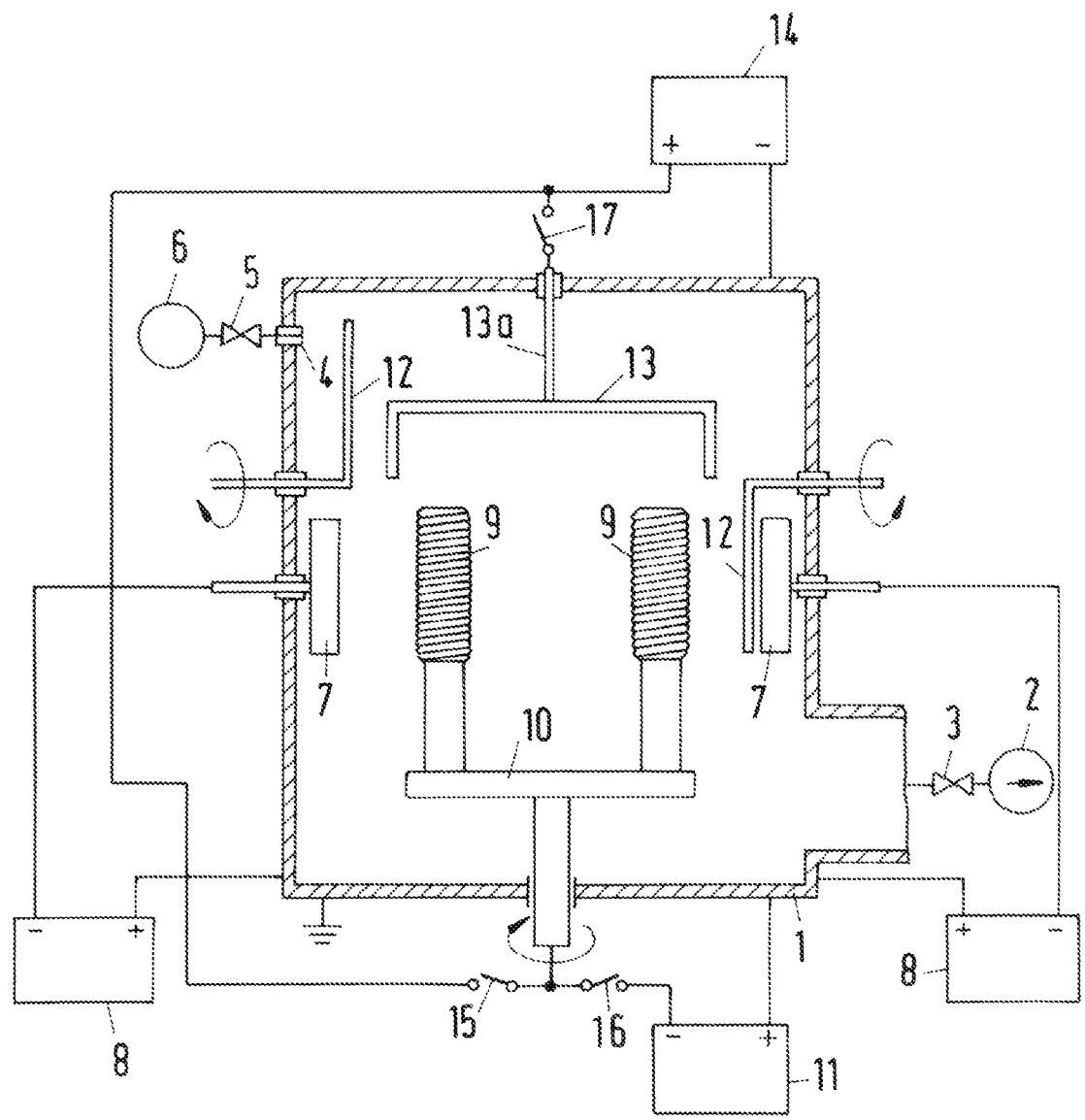
FIG. 1 shows an example of a known vacuum chamber for performing a plasma treatment.

In the drawings, examples are described that comprise one or more embodiments. In this regard, the invention is not limited to the examples described. For example, one or more features of an embodiment can also be realized in another embodiment or even provided in another type of device.

Before performing a coating process, such as a coating by means of physical vapor deposition (PVD) or a diamond-like carbon coating, an arc assisted glow discharge process (also ion etching process) can be performed on one or more substrates. In this case, the ion etching process is used to prepare or condition the surfaces, i.e., the substrate surfaces are heated and etched by means of an ion bombardment. This conditioning improves the bonding between the substrate and the coating. In FIG. 1, a conventional ion etching system is represented. The system comprises a vacuum chamber 1 with evaporators 7 (in the following, the term evaporator short for arc cathode of a cathodic vacuum arc evaporator) arranged on opposite sides of the chamber 1. The evaporators 7 are connected to direct current sources 8 and can be operated at voltages of 40 V and currents up to 300 A. Shutters or shields 12 are connected to the walls of the chamber 1 and are rotatably arranged in such a way that the shutters 12 can be rotated such that the corresponding electrode 7 is either shielded or unshielded. A linear electrode 13 is connected to the chamber and equally spaced from the evaporators 7. The linear electrode 13 can be connected to the current sources 11, 14 via switches 15, 16, 17 and has an equal voltage along the electrode 3 in the operating state. The current sources 11, 14 are additionally connected to the wall of the chamber 1 and can optionally be connected to a rotatable substrate holder 10 via the switches 15, 16. Gas, such as argon, can be admitted to the chamber 1 from a gas source 6 through the inlet 4 via the valve 5. When an arc discharge is ignited, electrons are generated by the evaporator 7 and accelerated toward the linear electrode 13. The electrons excite the argon gas atoms and thus generate partially ionized argon atoms, which are deposited on a surface of a substrate 9 to prepare it for the coating. This system can be adjusted only by means of the direct current sources 8, 11, 14 and the rotating substrate holder 10. Thus, the system is characterized by limited ionization, limited adjustability of plasma activation by the linear electrode 13, and limited adjustability of homogeneity in the chamber 1.

Figure 2:
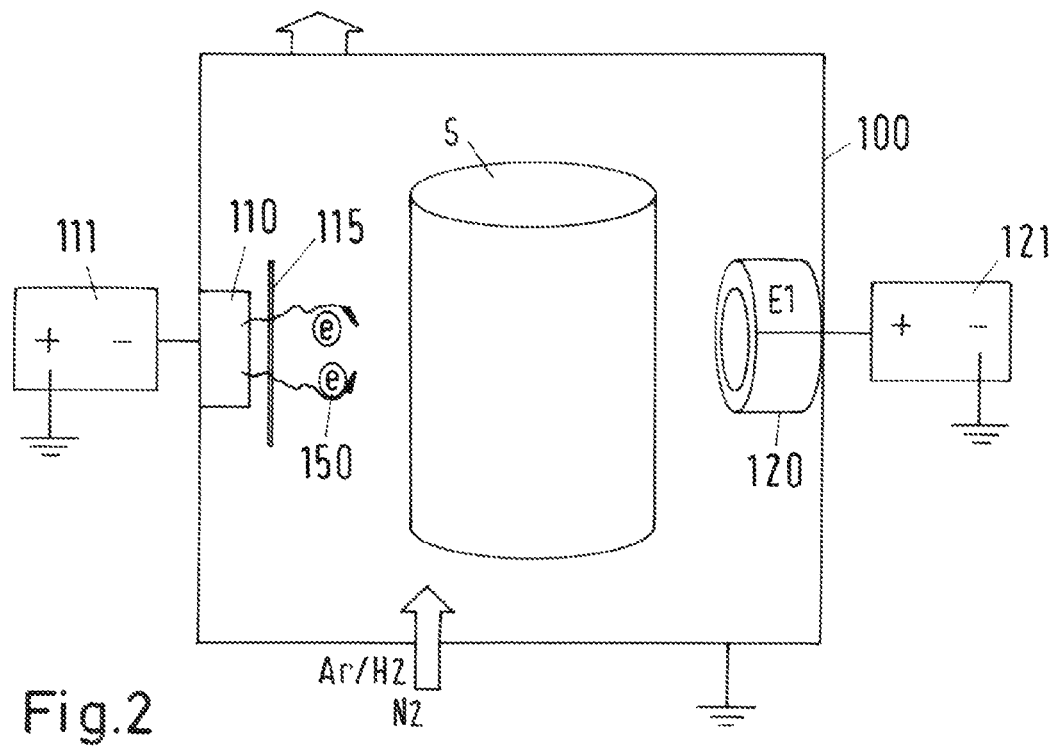
FIG. 2 shows a schematic representation of a vacuum chamber according to the invention for performing a plasma treatment with an electrode according to a first embodiment.

The embodiment according to FIG. 2 shows a schematically represented vacuum-tight chamber 100, an evaporator 110 which is provided in the chamber 100 and which can be arranged directly on the wall of the chamber 100. Furthermore, a power supply 111 is provided, which has a negative pole. This negative pole of the power supply 111 or the power source 111 is connected to the evaporator 110. Thus, in the present embodiment, the evaporator 110 is a cathode 110. As represented, the evaporator 110 emits arc electrons, which are first partially extracted and accelerated by the electrode according to the invention, and thus exciting the working gas argon (Ar) (often also neon (Ne) or any other suitable gas or mixture of gases) and consequently creating a plasma. For this purpose, a positive accelerating voltage is applied to the electrode 120, which enables an electrode current to the electrode. The control of the electrode can be achieved generally by the voltage or the current, or it can be achieved by the energy consisting of the product of voltage and current. The ions of the plasma then strike a surface of the substrate S, which is preferably provided in a centered manner in the chamber 100, in order to prepare and activate its surfaces, for example by cleaning or etching, for a subsequent coating process. Furthermore, a shield 115 is movably arranged in the chamber 100 of FIG. 2, so that the shield 115 can be optionally positioned between the evaporator 110 and the substrate S. Thus, before the ignition of the cathodic vacuum arc evaporation, the shield 115 may be either rotated or otherwise moved in front of the evaporator 110 to protect the substrate S from contamination by the evaporator 110 during this process. If the cathodic vacuum arc evaporation is not present, the shield can be moved to another suitable position.

According to FIG. 2, a single electrode 120 is provided. The electrode 120 is connected to a positive pole of a power supply 121, and consequently the electrode 120 is an anode 120. By using different currents and/or different time intervals at the current source 121 of the anode 120, the plasma that can be generated in the system can be influenced.

As represented in FIG. 2, the electrons emitted from the evaporator 110 are guided to the position of the electrodes/anodes 120 along a first and a second electron path 150. Thus, in turn, a plasma that can be generated in the chamber 100 can be accelerated in the same direction. Due to a suitable positioning of the first electrode 120 at a desired position, a better easier control of the plasma flow in the chamber 100 is possible and consequently an improved control of the ion bombardment and etching of the substrate.

Figure 2A:
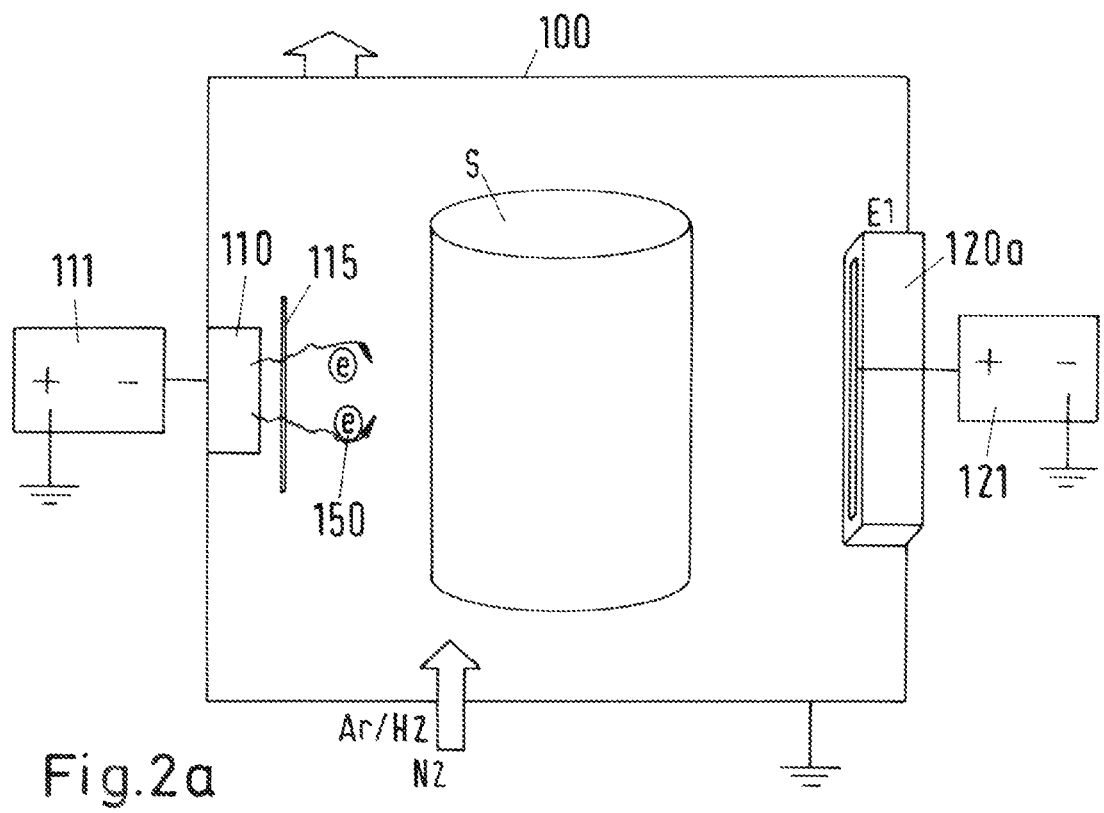

The embodiment according to FIG. 2a shows a schematically represented vacuum-tight chamber 100 with an analogous structure as the chamber 100 according to the embodiment according to FIG. 2. However, the two-dimensional surface for collecting the electrons emitted from the cathode of the first electrode 120a according to FIG. 2a is rectangular, whereas the two-dimensional surface of the first electrode 120 according to FIG. 2 is circular. In this case, the two-dimensional surface for collecting the electrons emitted from the evaporator has a first orthogonal extension and a second orthogonal extension to a surface normal, wherein the first orthogonal extension is perpendicular to the second orthogonal extension, and a length ratio of the first orthogonal extension to the second orthogonal extension is between 0.1 and 1. In the case of the circular electrode 120, the first orthogonal extension and the second orthogonal extension correspond in particular to the diameter of the two-dimensional surface. In the case of the rectangular electrode 120a, the first orthogonal extension corresponds to a first edge length and the second orthogonal extension corresponds to a second edge length of the two-dimensional surface.

Figure 2B:
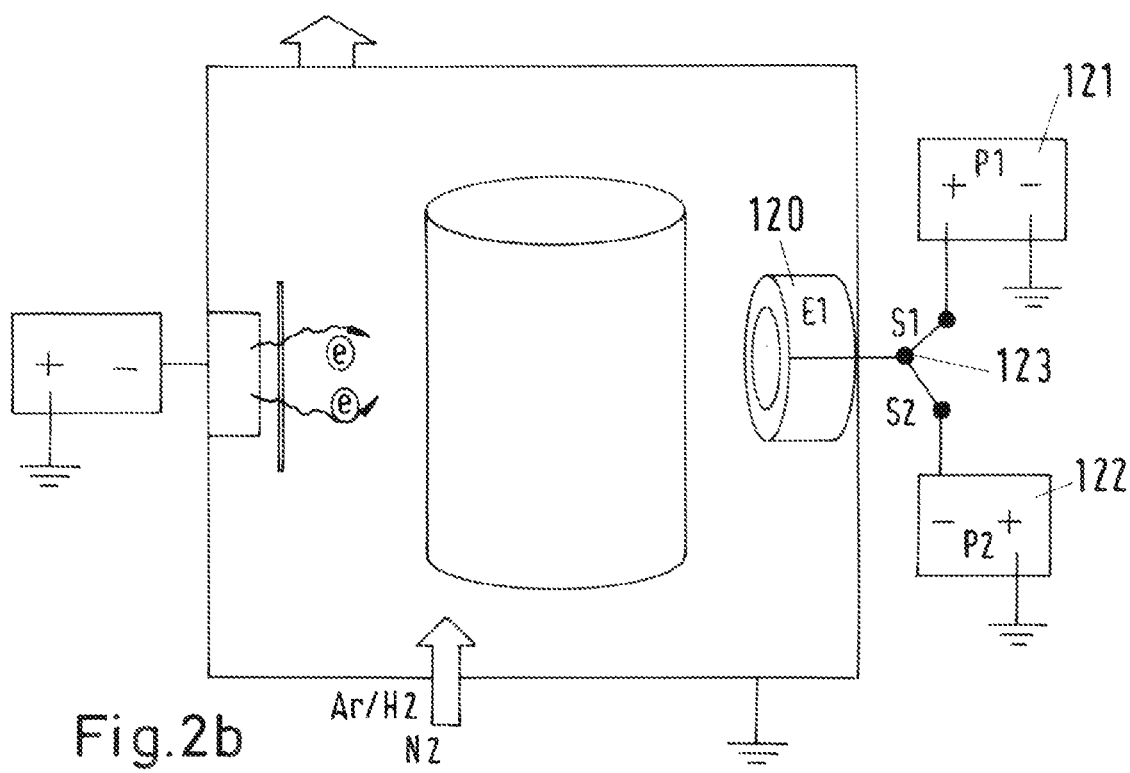

The embodiment according to FIG. 2b shows a schematically represented vacuum-tight chamber 100 with an analogous structure as the chamber 100 according to the embodiment according to FIG. 2. However, the embodiment according to FIG. 2b comprises a switch device 123 coupled between the first electrode 120 and the power supplies 121, 122. The power supply 121 is arranged with the positive pole on switch S1 of the switch device 123 and the power supply 122 is arranged with the negative pole on switch S2 of the switch device 123. When switch S1 is closed and switch S2 is open, the electrode 120 can be used as a plasma electrode according to the invention (i.e., also as an anode). When switch S1 is open and switch S2 is closed, the electrode 120 can be used for (arc) coating processes or sputtering processes (i.e., target).

Figure 2C:
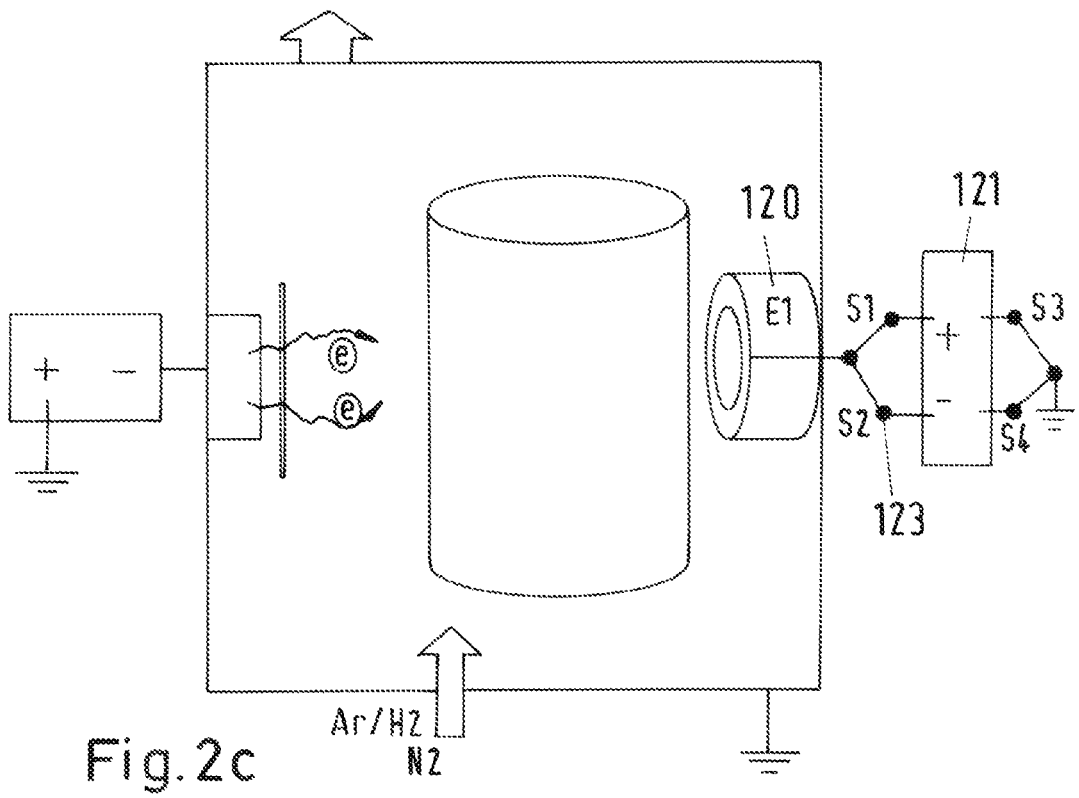

The embodiment according to FIG. 2c shows a schematically represented vacuum-tight chamber 100 with an analogous structure as the chamber 100 according to the embodiment according to FIG. 2. However, the embodiment according to FIG. 2c comprises a switch device 123 coupled between the first electrode 120 and the power supply 121. The power supply 121 is arranged with the positive pole on switch S1 of the switch device 123 and with the negative pole on switch S2 of the switch device 123. Furthermore, the positive pole of the power supply 121 is connected to a ground via the one switch S3 and the negative pole of the power supply 121 is connected to the ground via the one switch S4. When switch S1 is closed, switch S2 is open, switch S3 is open, and switch S4 is closed, the electrode 120 can be used as a plasma electrode according to the invention. When switch S1 is open and switch S2 is closed, switch S3 is closed, and switch S4 is open, the electrode 120 can be used for (arc) coating processes or sputtering processes.

Figure 3:
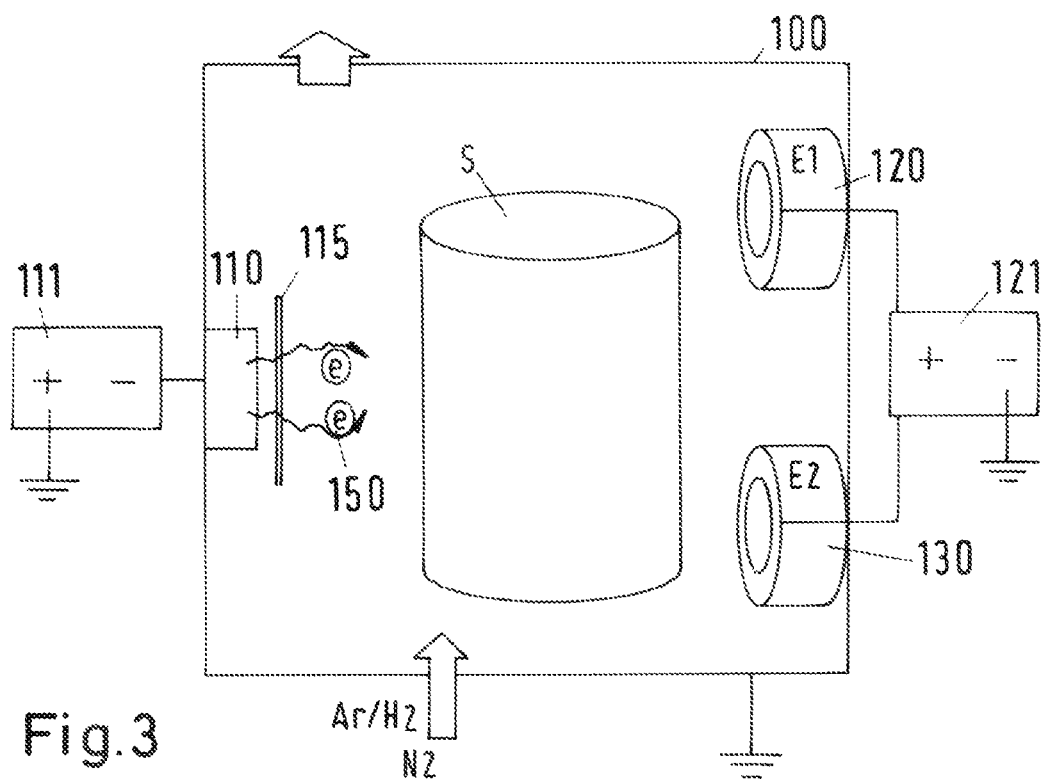
FIG. 3 shows a schematic representation of a vacuum chamber according to the invention for performing a plasma treatment with two electrodes according to the invention with a power supply according to another embodiment.

The embodiment according to FIG. 3 shows the schematically represented vacuum-tight chamber 100. In this case, the first electrode 120 and the second electrode 130 are connected to a positive pole of the same power supply 121 or the same power source 121. As a consequence, the first electrode 120 and the second electrode 130 are a first anode 120 and a second anode 130. By using different currents and/or different time intervals at the current source 121 of the anodes 120 and 130, the plasma that can be generated in the system can be influenced.

Since the common power supply is connected to the first electrode 120 and the second electrode 130, an equal voltage can be applied to the first electrode 120 and the second electrode 130 with this arrangement. This current can be applied to both electrodes 120, 130 at the same time and for the same duration.

Figure 4:
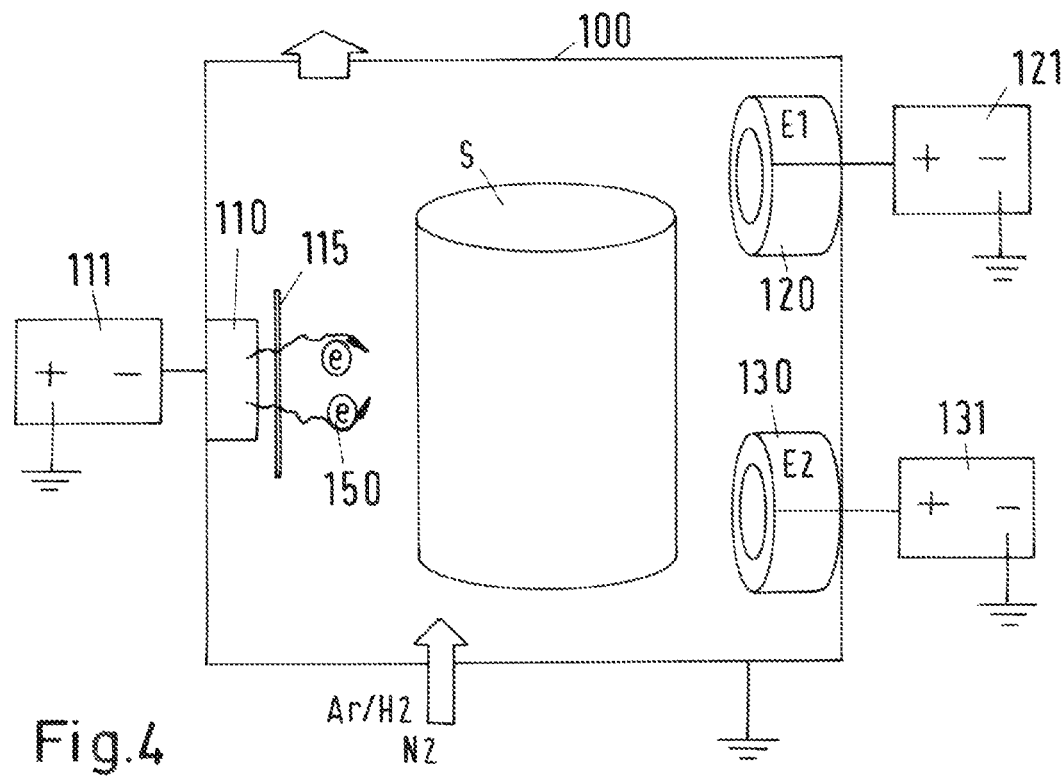
FIG. 4 shows a schematic representation of a vacuum chamber according to the invention for performing a plasma treatment with two electrodes according to the invention with two power supplies according to a further embodiment.

The embodiment according to FIG. 4 shows the schematically represented vacuum-tight chamber 100. In the embodiment according to FIG. 4, a first power supply 121 is arranged at the first electrode 120 and a second power supply 131 is arranged at the second electrode 130. In this case, the plasma that can be generated in the system can be influenced by using different currents and/or different time intervals at the first power supply 121 and the second power supply 131, in particular as the first power supply can supply the first electrode 120 with a first current and the second power supply can supply the second electrode 130 with a second current. Here, the first and second currents can be adjusted independently of each other, so that the distribution of the plasma can be shaped by the first and the second current. Here, the first power supply 121 may supply the first electrode 120 with the first current during a first time interval and the second power supply 131 may supply the second electrode 130 with the second current during a second time interval. The first and the second time intervals may be separate or overlapping, as desired.

In the embodiments according to FIGS. 2 to 4, a single evaporator 110 in each case is present, whereby a plasma arc is generated with at least one anode 120, 130.

Figure 9:
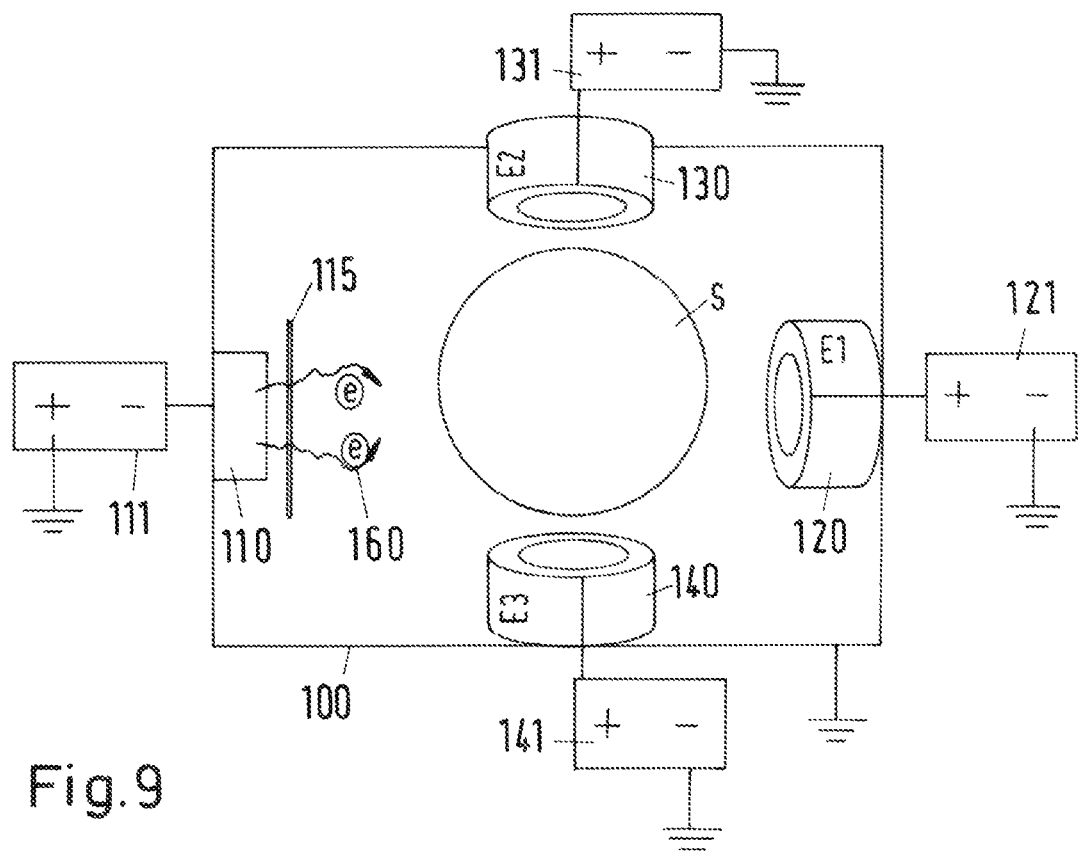
FIG. 9 shows a schematic representation of a vacuum chamber according to the invention for performing a plasma treatment with three electrodes according to the invention, on different chamber walls according to another embodiment.

Embodiments of plasma sources are schematically represented in FIGS. 3, 4 and 9. In order to be able to better control the flow of electrons in the chamber 100 (i.e., a vacuum chamber according to the invention, hereinafter referred to as chamber), a plurality of electrodes 120, 130, 140 according to the invention having a two-dimensional surface for collecting the electrons emitted from a cathode is provided, which can be arranged in the chamber, unlike in the case of the device comprising a linear electrode according to FIG. 1. A very important advantage of this arrangement is the possibility to position the electrodes on one or more walls of the chamber, whereby an improvement of a distribution of the substrates to be treated with plasma in the chamber is made possible. As a result, the area in the chamber for plasma treatment can be better utilized, resulting in higher efficiency. For example, a vacuum-tight chamber 100 is schematically represented in FIG. 3 or 4. An evaporator 110 is provided in the chamber 100 and can be arranged directly in the wall or on the wall of the chamber 110. The evaporator 110 can comprise one or more metals, such as titanium and/or any other metal intended for evaporation. A negative pole of the power supply or power source is connected to the evaporator 110, thus connecting the evaporator 110 in the form of a cathode. For example, when the evaporator 110 is ignited by means of a trigger unit, arc electrons are emitted which are accelerated by means of the electrode according to the invention and collide with one or more gases such as argon (Ar), neon (Ne) or any other suitable gas or gases which have been admitted into the chamber 110, and thus create a plasma. Then, the ions of the plasma bombard the surfaces of the one or more substrates (not shown here) that are provided in the chamber 100 to prepare their surfaces for a subsequent coating process, for example, by cleaning or etching. One or more shields 115 are movably provided in the chamber 100 so that the shield 115 can be optionally positioned between the evaporator 110 and the substrate. Thus, the shield 115 may be either rotated or otherwise moved in front of the evaporator before the ignition of the cathodic vacuum arc evaporation to protect the substrates from contamination by the evaporator 110 during this process. If the cathodic vacuum arc evaporation is not present, the shield can be moved to another suitable position.

According to FIGS. 3 and 4, two electrodes, a first electrode 120 and a second electrode 130 are provided in the chamber 100. The first and second electrodes 120, 130 are connected to a positive pole of the at least one power supply or current source, and thereby connect the first and second electrodes 120, 130 as first and second anodes. For example, as represented in FIG. 3, a common power supply 121 can be connected to the first electrode 120 and the second electrode 130. In this arrangement, an equal voltage can be applied to the first electrode 120 and the second electrode 130. This voltage can be applied to both electrodes 120, 130 at the same time and for the same duration. As an alternative, according to FIG. 4, a first power supply 121 may supply a current to the first electrode 120 during a first time interval and a second power supply 131 may supply a current to the second electrode 130 during a second time interval. The first and the second time intervals may be separate or overlapping, as desired. In another embodiment, the first electrode 120 may be connected to a first power supply 121 and the second electrode 130 may be connected to a second power supply 131. Thus, the first power supply 121 can supply the first electrode 120 with a first current and the second power supply 131 can supply the second electrode 130 with a second current. By using different currents and/or different time intervals, the plasma generated in the system can be influenced, controlled or even homogenized.

As represented in FIGS. 3 and 4, the electrons emitted from the evaporator 110 flow to the positions of the first and second electrodes 120, 130. By a suitable positioning of the individual first electrode 120 and second electrode 130 at the desired locations, a better control of the plasma flow in the chamber 100 is possible and consequently an improved control of the ion bombardment and etching of the substrate S. FIG. 9 illustrates an embodiment in which three individual electrodes, a first electrode 120, a second electrode 130, and a third electrode 140 are provided. Thus, a corresponding first, second, and third electron path 160 results, which in each case is directed toward the first, second, and third electrodes 120, 130, 140. In the schematic drawings according to FIGS. 3 and 4, the electrodes 120, 130 are arranged opposite the evaporator 110. However, in the schematic drawing according to FIG. 9, the electrodes 120, 130, 140 are arranged on different chamber parts. However, it is understood that any suitable positioning of the first, second or optionally third electrode is possible to influence the electron flow in such a way that an improved plasma activation and homogeneity in the chamber can be achieved. Accordingly, any number of electrodes in the chamber is possible to guide the electron flow to a desired path. The evaporator 110 according to FIGS. 3, 4 and 9 can be used with an applied current of 100 A; however, any other suitable current may of course be used.

Figure 5:
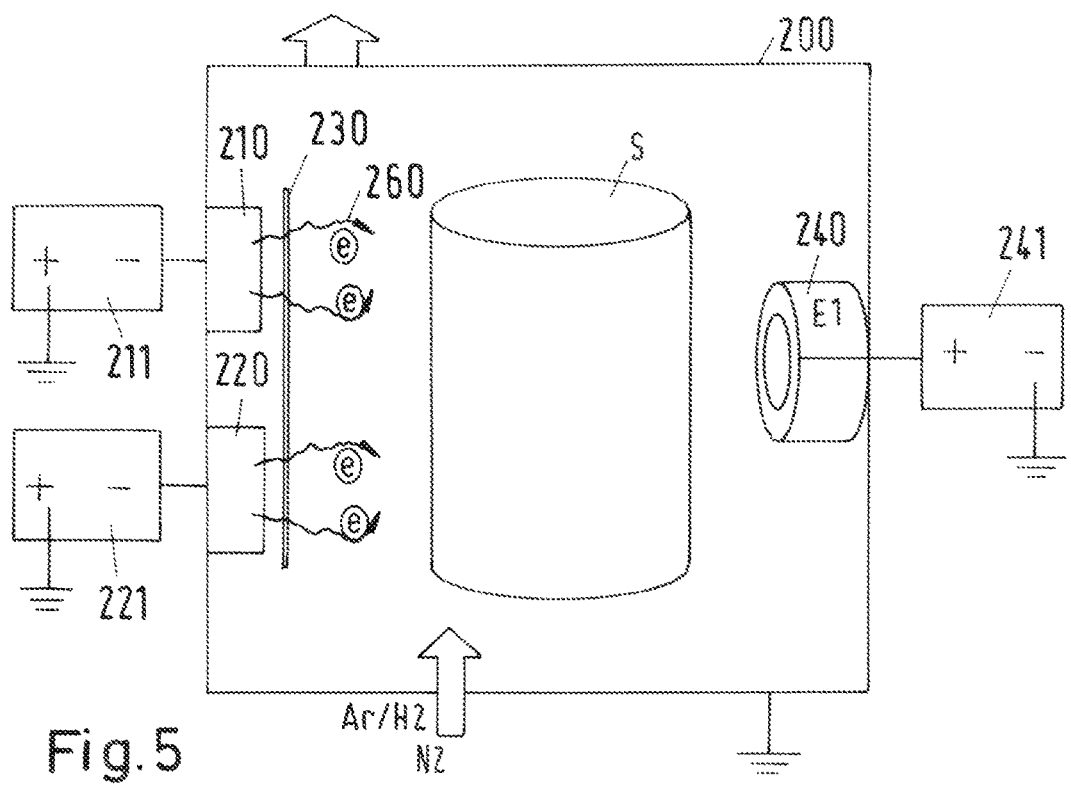
FIG. 5 shows a schematic representation of a vacuum chamber according to the invention for performing a plasma treatment with an electrode according to the invention and two cathodes according to a further embodiment.

FIG. 5 shows a further embodiment of a chamber 200 in which several evaporators are provided. The chamber 200 comprises a first evaporator 210 and a second evaporator 220 that are connected as cathodes, i.e., connected to a negative pole of a first power supply 211 and a second power supply 221. The first and second evaporators 210, 220 are provided on the wall of the chamber 200. As an alternative, the first or second evaporator 210, 220 may also be arranged on a suitable structure of the wall of the chamber 200 or in the chamber 200. A rotatable or otherwise movable shield 230 is provided near the first and second evaporator 210, 220. The shield 230 may have a size that is sufficient to shield both evaporators 210, 220. As an alternative, the chamber 200 may comprise a first and a second shield, which is associated with the first evaporator and the second evaporator 210, 220, respectively (not shown here). Furthermore, a first electrode 240 is provided in the chamber 200, which is connected as an anode, i.e., connected to the positive pole of a first current source 241. As represented by the electron paths 260, the electrons emitted from the first evaporator 210 and the electrons emitted from the second evaporator 220 flow toward the first electrode 240. It is understood that any desired number of evaporators may be used with any desired number of individual electrodes, so that the system may comprise a suitable number of evaporators and a suitable number of electrodes.

Figure 6:
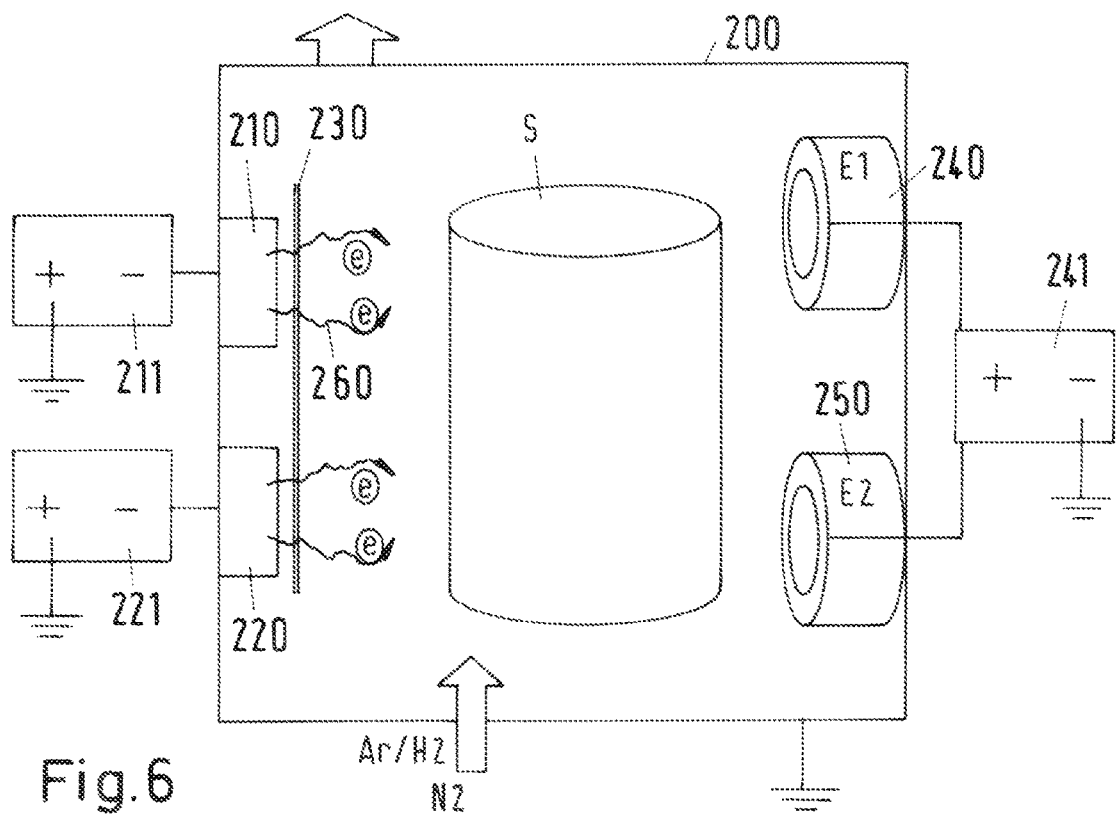
FIG. 6 shows a schematic representation of a vacuum chamber according to the invention for performing a plasma treatment with two electrodes according to the invention and two cathodes according to a further embodiment.

The embodiment according to FIG. 6 shows a schematically represented vacuum-tight chamber 200 with an analogous structure as the chamber 200 according to the embodiment according to FIG. 5. However, the embodiment according to FIG. 6 differs from FIG. 5 in that a first electrode 240 and a second electrode 250 are present. In this case, the first electrode 240 and the second electrode 250 are connected to a positive pole of the same power supply 241 or the same power source 241. As a consequence, the first electrode 240 and the second electrode 250 are switched as a first anode 240 and a second anode 250.

Since the common power supply is connected to the first electrode 240 and the second electrode 250, an equal current can be applied to the first electrode 240 and the second electrode 250 in this arrangement. This current can be applied to both electrodes 240, 250 at the same time and for the same duration.

FIG. 6 shows a further embodiment of a plasma source in which several evaporators are provided. A chamber 200 comprises a first evaporator 210 and a second evaporator 220 that are connected as cathodes. The first and second evaporator 210, 220 can be provided in the wall of the chamber 200 or otherwise on the chamber 200. As an alternative, the first or second evaporator 210, 220 can be arranged on a suitable structure of the chamber 200 or in the chamber 200. A rotatable or otherwise movable shield 230 is provided near the first and second evaporator 210, 220. The shield 230 may have a size that is sufficient to shield both evaporators 210, 220. As an alternative, the chamber 200 can comprise a first and second shield that are associated in each case with the first evaporator 110 and the second evaporator 220. Furthermore, a first electrode 240 and a second electrode 250 are provided in the chamber 200, both of which are connected as anode. As represented by the electron paths 260, the electrons emitted from the first evaporator 210 flow toward the first electrode 240 and the electrons emitted from the second evaporator 220 flow toward the second electrode 250. It is understood that any desired number of evaporators can be used with any desired number of individual electrodes. Thus, for example, the system of FIG. 6 can comprise two evaporators and four individual electrodes so that electrons flow from the first evaporator 210 to two individual electrodes and the electrons flow from the second evaporator to two other individual electrodes.

Figure 7:
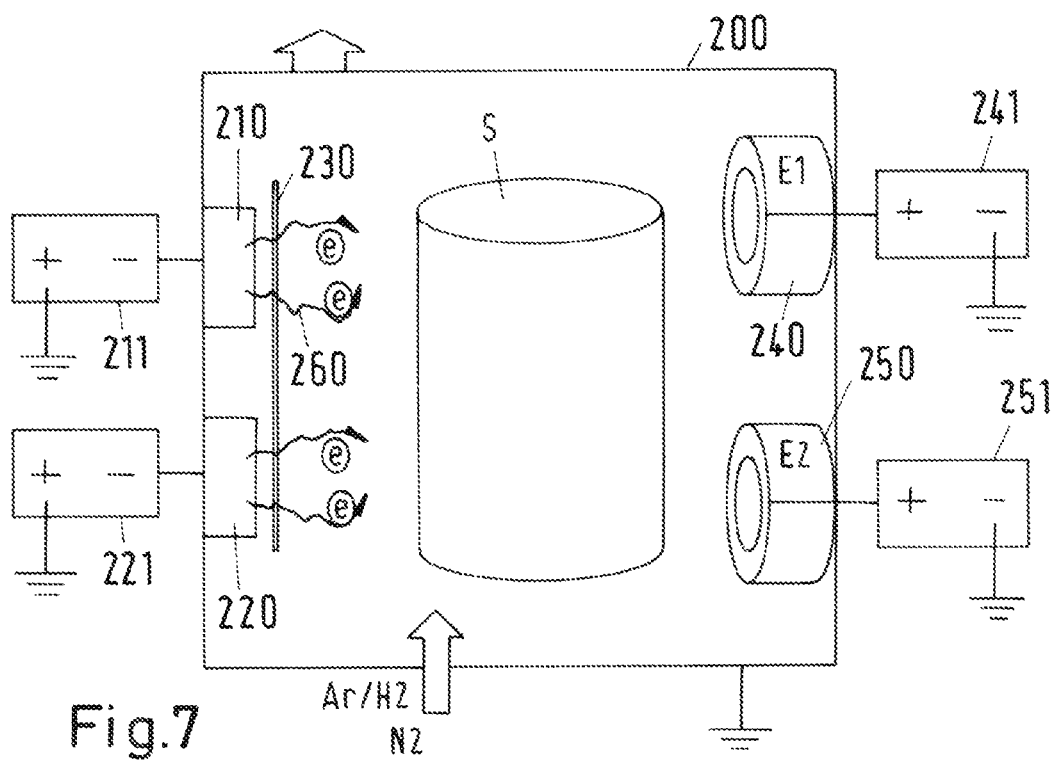
FIG. 7 shows a schematic representation of a vacuum chamber according to the invention for performing a plasma treatment with two electrodes according to the invention and two cathodes according to a further embodiment.

The embodiment according to FIG. 7 shows a schematically represented vacuum-tight chamber 200 with an analogous structure as the chamber 200 according to the embodiment according to FIG. 6. However, the embodiment according to FIG. 7 differs from FIG. 6 in that a first power supply 241 is arranged at the first electrode 240 and a second power supply 251 is arranged at the second electrode 250. Here, the plasma that can be generated in the system can be influenced by using different currents and/or different time intervals at the first power supply 241 and the second power supply 251, in particular as the first power supply can supply the first electrode 240 with a first current and the second power supply can supply the second electrode 250 with a second current. In this case, the first and second currents can be independently adjustable, so that the distribution of the plasma can be shaped by the first and second current. Here, the first power supply 241 may supply the first electrode 240 with the first current during a first time interval and the second power supply 251 may supply the second electrode 250 with the second current during a second time interval. The first and the second time intervals may be separate or overlapping, as desired.

In the embodiments according to FIGS. 5 to 7, two evaporators 210, 220 in each case are present with at least one anode 240, 250.

Figure 8:
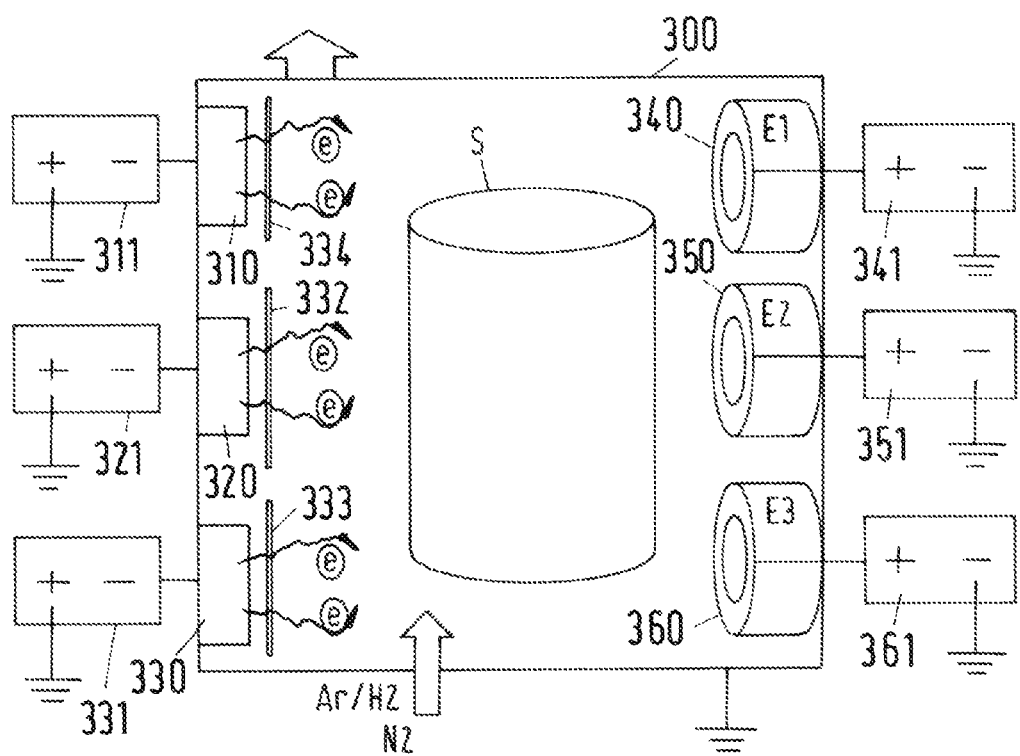
FIG. 8 shows a schematic representation of a vacuum chamber according to the invention for performing a plasma treatment with three electrodes according to the invention and three cathodes according to a further embodiment.
Figure 8A:
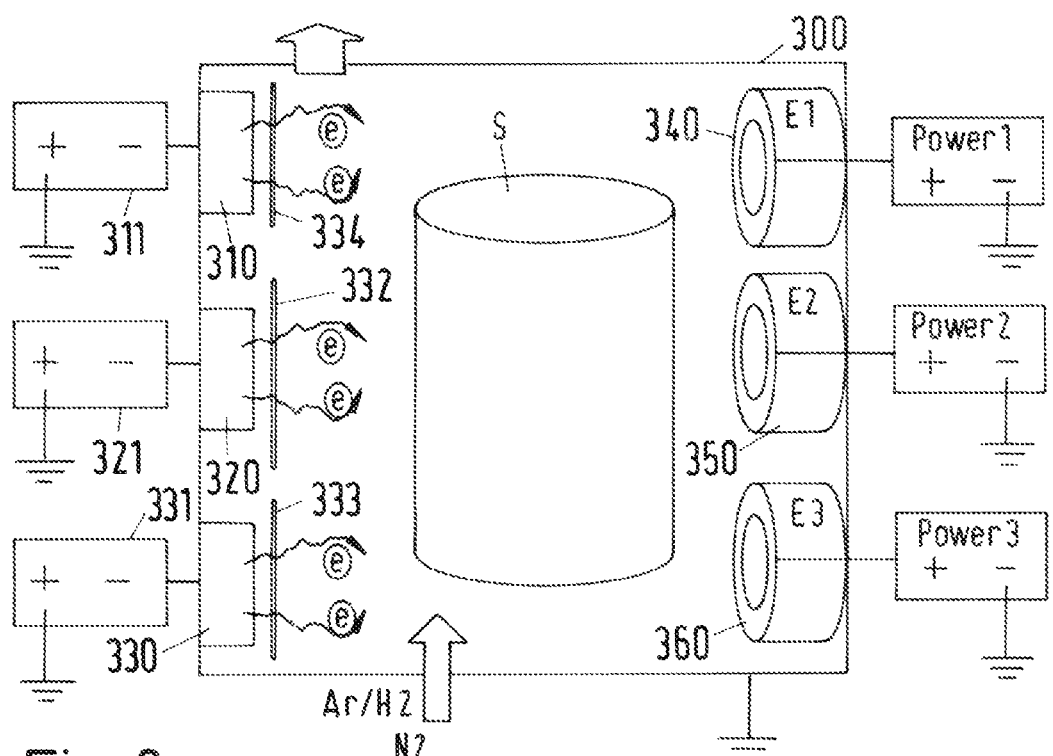
FIG. 8a shows a schematic representation of a vacuum chamber according to the invention for performing a plasma treatment with three electrodes according to the invention and three cathodes according to a further embodiment.

The embodiment according to FIG. 8 can be used in large systems in particular. Several plasma sources may be provided in the chamber by arranging evaporators 311, 321, 331 and electrodes 340, 350, 360 along the height of the chamber, this means along the height of the plasma treatment area, the plasma source in each case comprising at least one evaporator and one, two or more individual electrodes. Here, each electrode can be supplied by its own power supply or even a switchable power supply can be used by several electrodes simultaneously.

The chamber 300 of FIG. 8 comprises a first evaporator 310, a second evaporator 320, and a third evaporator 330 that are connected as cathodes, i.e., connected to a negative pole of a first power supply 311, a second power supply 321, and a third power supply 331. The first, second, and third evaporators 310, 320, and 330 are provided on the same wall of the chamber 300. As an alternative, the first, second, and third evaporators 310, 320, and 330 may also be arranged on a suitable structure of the wall of the chamber 300 or in the chamber 300. Furthermore, first, second, and third evaporators 310, 320, and 330 may be arranged on different walls, respectively first and third evaporators 310 and 330 on one wall and the second evaporator 320 on another wall. Three rotatable or otherwise movable shields 334, 332, and 333 are in each case provided near the first, second, and third evaporator 310, 320, and 330. As an alternative, the chamber 300 may comprise a shield which has a size that is sufficient to shield all of the evaporators 310, 320, 330. Furthermore, a first electrode 340, a second electrode 350 and a third electrode 360 are provided in the chamber 300, which are connected as anodes 340, 350, 360, i.e., connected in each case with the positive pole to a first power supply 341, a second power supply 351 and a third power supply 361. As represented by the electron paths, the electrons emitted from the first evaporator 310, the electrons emitted from the second evaporator 320, and the electrons emitted from the third evaporator 330 flow toward the three anodes 340, 350, 360.

In the schematic drawing according to FIG. 8, the electrodes 340, 350, 360 are arranged opposite the evaporators 310, 320, 330. However, it is understood that any suitable positioning of the first, second and third electrode is possible to influence the electron flow in such a way that an improved plasma activation and homogeneity in the chamber can be achieved. Accordingly, any number of electrodes in the chamber is possible to direct the electron flow to a desired path. The current applied to the evaporators 310, 320, 330 can be 100 A, but of course any other suitable current can be used.

Thus, in the embodiment according to FIG. 8, three evaporators 310, 320 and 330 are present with three anodes 340, 350 and 360.

FIG. 8 a shows a further embodiment of a chamber 300, with an analogous structure to the chamber in FIG. 8, but the power supplies of the first electrode 340, the second electrode 350, and the third electrode 360 are operated at different energies. Inter alia, via the different energies, the homogeneity of a plasma can be improved, as well the distribution of a plasma can also be better controlled by adjusting the energies at the respective power supplies accordingly.

As can be recognized from FIGS. 4 to 8, the substrate S can be biased negatively as well as positively, whereby the positive bias must be less than that of the electrode, as otherwise all electrons will flow to the substrate. Of course, an appropriately biased substrate is also suitable for additional plasma control. Furthermore, a working gas and a process gas are supplied to the chamber 100, 200 in the operating state. Here, the working gas is preferably argon (Ar) and hydrogen ($H_2$), and the process gas is preferably nitrogen ($N_2$).

The embodiment according to FIG. 9 shows a schematically represented vacuum-tight chamber 100 with an analogous structure as the chamber 100 according to the embodiment according to FIG. 2. However, the embodiment according to FIG. 9 differs from FIG. 2 in that a first electrode 120, a second electrode 130 and a third electrode 140 are present and in that a first power supply 121 is arranged at the first electrode 120, a second power supply 131 at the second electrode 130 and a third power supply 141 at the third electrode 140. In this case, the plasma that can be generated in the system can be influenced by using different energies and/or different time intervals at the first power supply 121, the second power supply 131, and the third power supply 141, in particular as the first power supply 121 supplies the first electrode 120 with a first energy and the second power supply 131 can supply the second electrode 130 with a second energy and the third power supply 141 can supply the third electrode 140 with a third energy. In this case, the first, second, and third energies can be independently adjustable from each other, so that the distribution of the plasma can be shaped by the first, the second, and the third energies.

FIG. 9 illustrates an embodiment in which three individual electrodes, a first electrode 120, a second electrode 130, and a third electrode 140 are thus provided. Thus, a corresponding first, second and third electron path 160 results, which is directed towards the first, second and third electrode 120, 130, 140 in each case. In the schematic drawings according to FIG. 13, the electrodes 120, 130, 140 are arranged opposite the evaporator 110. However, it is understood that any suitable positioning of the first, second or optionally third electrode is possible to influence the electron flow in such a way that an improved plasma activation and homogeneity in the chamber can be achieved. Accordingly, any number of electrodes in the chamber is possible to direct the electron flow to a desired path.

Figure 9A:
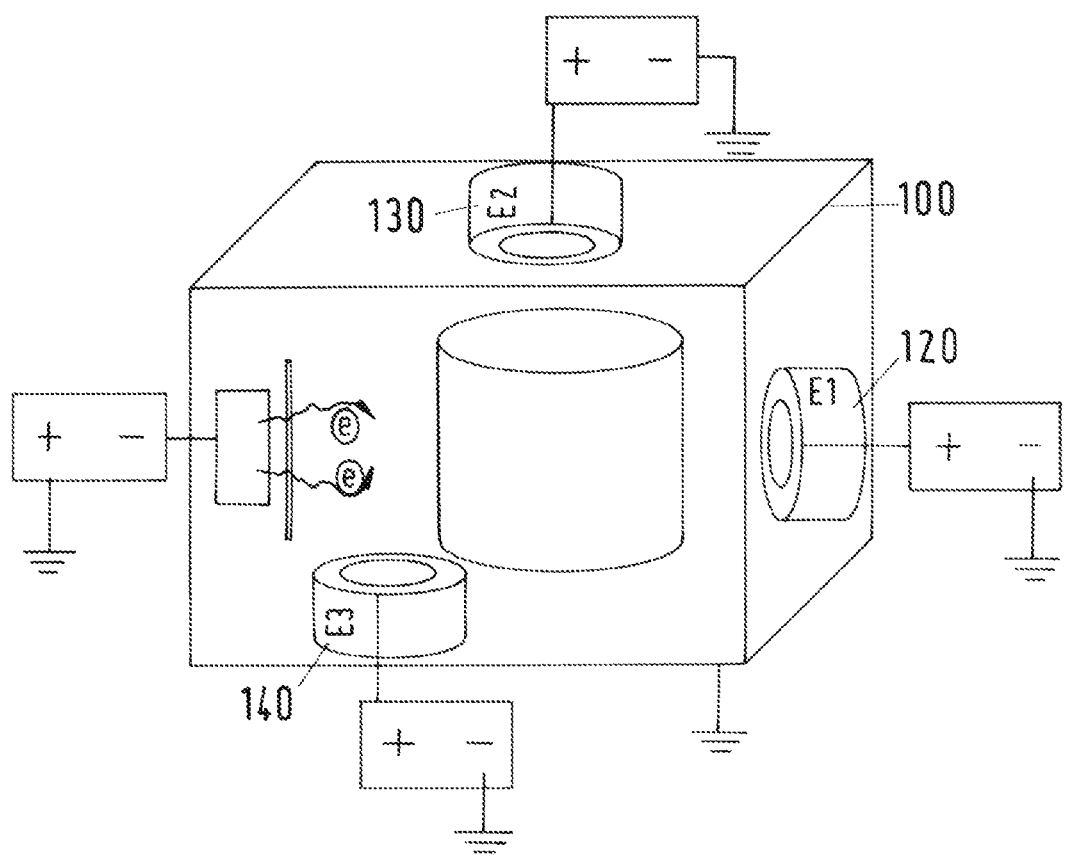
FIG. 9a shows a schematic representation of a vacuum chamber according to the invention for performing a plasma treatment with three electrodes according to the invention, on different chamber parts according to another embodiment.

The embodiment according to FIG. 9a shows a schematically represented vacuum-tight chamber 100 with an analogous structure as the chamber 100 according to the embodiment according to FIG. 9. However, in the embodiment according to FIG. 9a, the electrodes 120, 130, 140 are not only arranged on chamber walls of the chamber 100. The first electrode 120 is arranged on a chamber wall, the second electrode 130 is arranged on a chamber ceiling, and the third electrode 140 is arranged on the chamber floor. The arrangement of the electrodes in the chamber can be adjusted as desired to control, inter alia, a plasma distribution.

While various exemplary configurations have been shown and described within the framework of this application, other embodiments with any number of evaporators and any number of electrodes naturally fall within the scope of protection of the invention claimed herein. Furthermore, a vacuum chamber according to the invention can be used for ion etching processes and can be equipped with a plurality of individual electrodes, whereby different electrodes can be supplied with different currents. The same or different currents can be applied to the different electrodes, even at different times, to manipulate the plasma activation and etching as desired.

The electron paths 150, 160, 260 included in the figures are represented only schematically, since the electron paths 150, 160, 260 of course pass by the shields 115, 230, 332, 333, 334 and do not pass through them.

In FIGS. 2 to 9a, a magnet for generating a magnetic field (not shown here) is arranged in the vacuum chamber, particularly in the vicinity of the electrodes, or in the vicinity of at least one electrode of this plurality in the case of a plurality of electrodes. This magnet is particularly preferably arranged on the working surface of the electrode. Generally, the magnet may comprise a front-side magnet and/or a rear-side magnet. The front-side magnet is arranged in the area of the working surface for generating a front-side magnetic field and the rear-side magnet is arranged behind the working surface for generating a rear-side magnetic field. When a plurality of electrodes is present, a front-side and/or a rear-side magnet may also be arranged on an electrode or on a subset of the plurality of electrodes. The substrate S can be either negatively or positively biased, wherein the positive bias should be less than that of the electrode, as otherwise all the electrons will flow to the substrate. In the operating state, argon (Ar) and hydrogen (H$_2$) can preferably be supplied as the working gas, and nitrogen (N$_2$) can preferably be supplied as the process gas.

Figure 10:
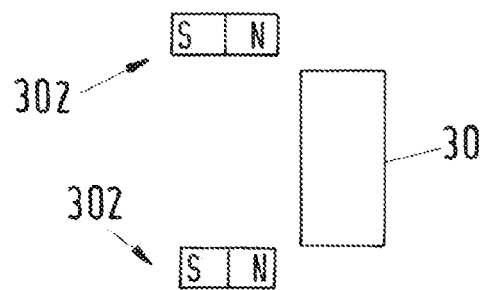
FIG. 10 shows a schematic representation of a vacuum chamber according to the invention for performing a plasma treatment according to an embodiment of the invention with a front-side magnet.
Figure 11:
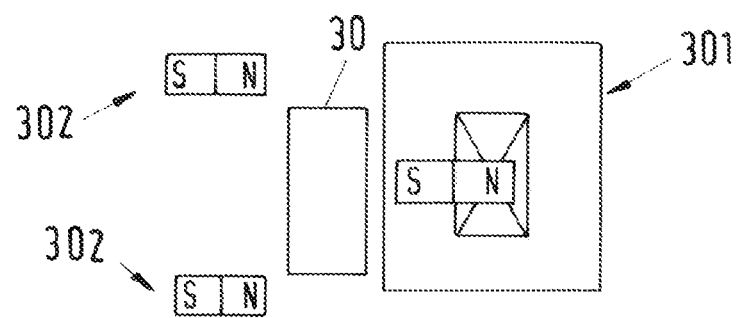
FIG. 11 shows a schematic representation of a vacuum chamber according to the invention for performing a plasma treatment according to a further embodiment with a front-side and a rear-side magnet.
Figure 12:
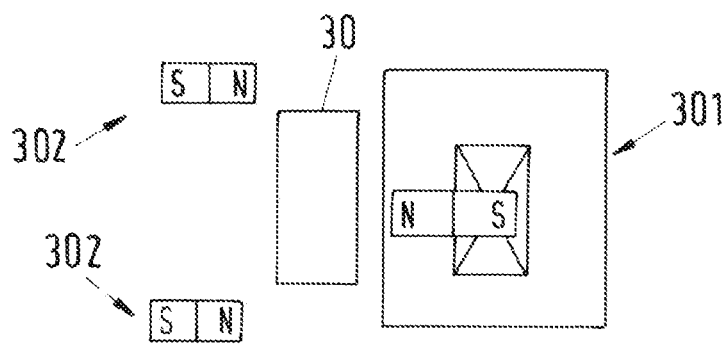
FIG. 12 shows a schematic representation of a vacuum chamber according to the invention for performing a plasma treatment according to another embodiment with a front-side and a rear-side magnet.

Now, we turn to FIGS. 10 to 12, in which embodiments are shown in which magnetic fields can be applied to the individual electrodes of the vacuum chamber. An electron path can be controlled in a magnetic field, which affects the charged particles in the plasma accordingly. More precisely, the diffusion of the charged particles is hindered by the magnetic field. As a result, the loss of electrons and ions is reduced, and the electron density is increased. Typically, electromagnets in the form of coils are positioned around the chamber from one end to an opposite end to create a magnetic field within the chamber. Other conventional systems use permanent magnets that are arranged underneath the substrate and moved to generate the magnetic field. However, none of these configurations allows to control the flow of electrons in such a way that the homogeneity can be adjusted and improved. In the embodiments described here, a magnetic field is applied to each individual electrode. FIG. 10 shows an embodiment in which an electrode 300 is arranged adjacent to or within an electromagnet 302. For example, the electromagnet 302 may be a coil that is wound around the electrode 30, that is, arranged in the area of a working surface of the electrode. In this case, the magnetic field at the electrode 30 is front-side. No rear-side magnetic field has been generated.

Figures 19, 20:
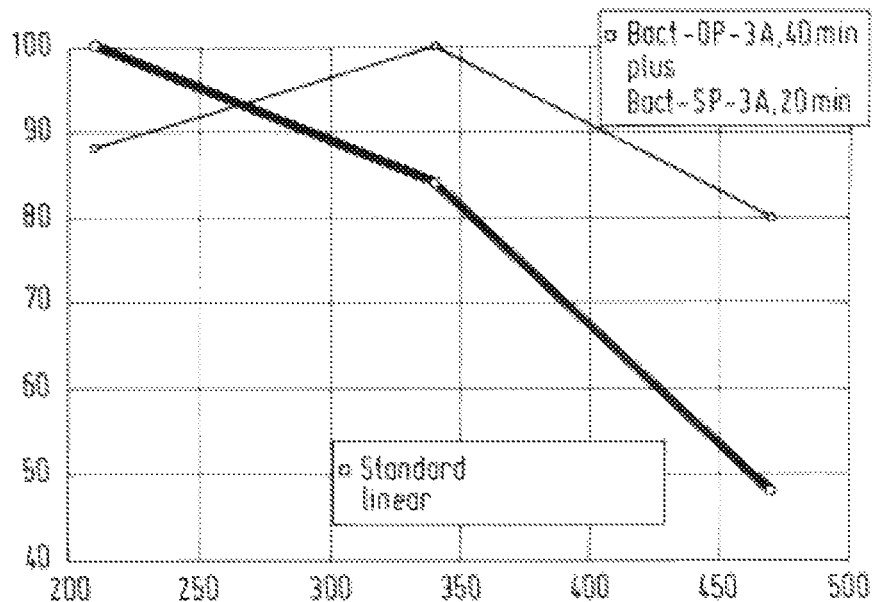
FIG. 19 shows a diagram of an etching depth according to an embodiment system according to the invention.
FIG. 20 shows a table of experimental results comparing various glow discharge systems with the known state of the art.

The FIGS. 11 to 12 show embodiments with rear-side magnets 320 and front-side magnets 310. In FIG. 11, the electrode 30 comprises the electromagnetic coil 302 that is provided near or around the electrode 30 (i.e., arranged in the area of the working surface and/or at least partially next to the working surface). An electromagnetic coil 301 is positioned near the electrode 30 behind the working surface to generate as a rear-side magnet a rear-side magnetic field. The electromagnetic coil may comprise a ferritic core or may not comprise a ferritic core, depending on the desired magnetic field strength. As shown, the two coils 301, 302 are arranged in such a way that they have the same polarity. In FIG. 12, the magnetic fields between the electromagnetic coils 301 and 302 have an opposite polarity. This change in the polarity of the (rear-side and front-side) magnetic fields can be achieved by changing the direction of the current through the coil 301. Thus, the magnetic field can be adjusted on a single coil. The diagram of FIG. 19 shows an example of the magnetic field strength (in mT, Y-axis) which was measured perpendicular to the surface (round electrode, 5 cm radius, zero point corresponds to the center of the electrode, X-axis radius starting from the center of the electrode in cm) at a coil current of 3A. The middle curve shows the strength of the magnetic field of FIG. 10, where no rear-side magnetic field was generated. The upper curve shows the strength of the magnetic field according to FIG. 11, where the magnetic field was generated by coils that are equally polarized; and the lower curve shows the strength of the magnetic field according to FIG. 12, in which the magnetic field was generated by coils which are oppositely polarized. In the case of the upper curve, a tunnel field is present, since the upper curve is in the negative range from about ±3.2 and thus the magnetic field has a reversed direction from this radius. However, in the case of the lower curve, the magnetic field emerging from the work surface has only one direction.

Figure 13:
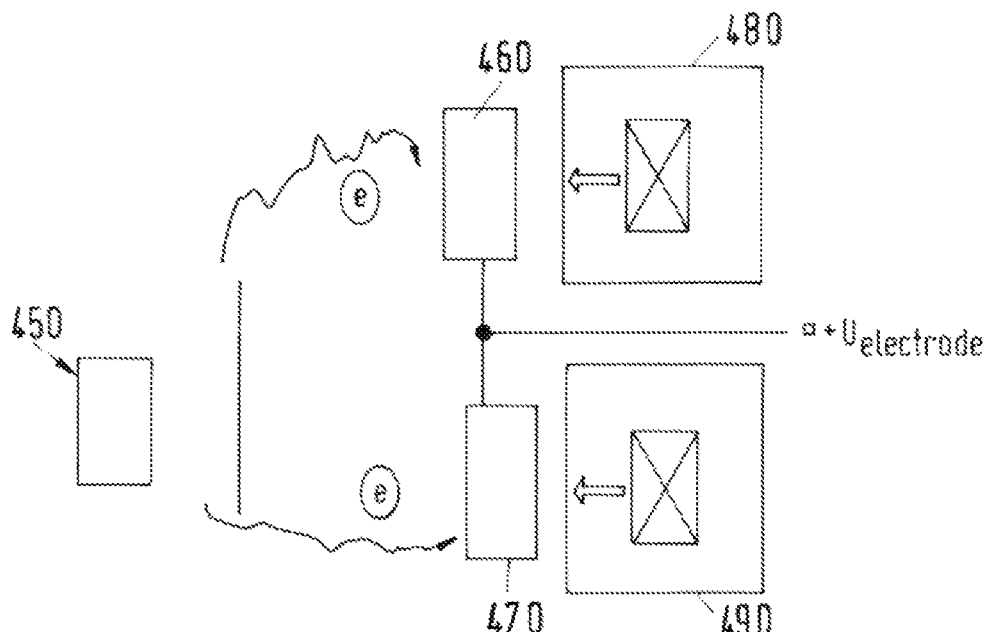
FIG. 13 shows a schematic representation of a magnetic field configuration for two electrodes according to an embodiment.

FIG. 13 shows another embodiment of the present invention. The system shown in FIG. 13, is a vacuum chamber for performing a plasma treatment with a magnetic field configuration for two electrodes. An evaporator 450 is provided within the chamber and may be directly (at least partially) embedded in or connected to the chamber wall. A negative pole of a 100 A power source may be connected to the evaporator and connects the evaporator thereto as a cathode. Thus, electrons are emitted when the evaporator is ignited and the electrons collide with an argon (Ar) gas that has been introduced into the chamber, thus creating the plasma. The ions in the plasma then bombard the surfaces of one or more substrates not shown, which are arranged in the chamber to be cleaned and/or etched. One or more shields are movably positioned in the chamber in such a way that the shields can be optionally positioned between the evaporator and the substrate. Thus, before the ignition of the cathodic vacuum arc evaporators, the shield may be rotated or otherwise moved in front of the evaporator 450 to protect the substrate from contaminations. When the arc generated by the cathodic vacuum arc evaporator is not present, the shields can be moved to a non-shielding position. In a chamber according to the invention, at least one single electrode should be provided in the chamber. However, in FIG. 13, a first electrode 460 and a second electrode 470 are provided, which are connected to a positive pole of a (for example, 80 A) power supply (also a current source) and thus connects the electrodes 460, 470 as anodes. Accordingly, the electrons flow from the evaporator 450 in the direction of the position of the electrodes 460, 470. This accelerates the generated plasma in the same direction. A first rear-side magnet 480 and a second rear-side magnet 490 are arranged behind the working surfaces of the electrodes 460, 470 for generating a rear-side magnetic field. The rear-side magnetic fields can be applied to the electrodes by means of an electromagnet by arranging an electromagnetic coil behind the working surfaces of the electrodes 460, 470. When using electrodes with magnetic fields, the substrate current can be increased, in particular doubled, with substantially the same ion etching performance, resulting in increased etching of the substrate (of the substrates).

Although only a single evaporator 450 is shown in FIG. 13, any number of evaporators and also electrodes can be used in the system (as already shown in the explanations of FIGS. 5 to 8*a*). For example, larger systems and/or larger chambers may require two or more evaporators to generate a larger number of electrons.

Figure 14:
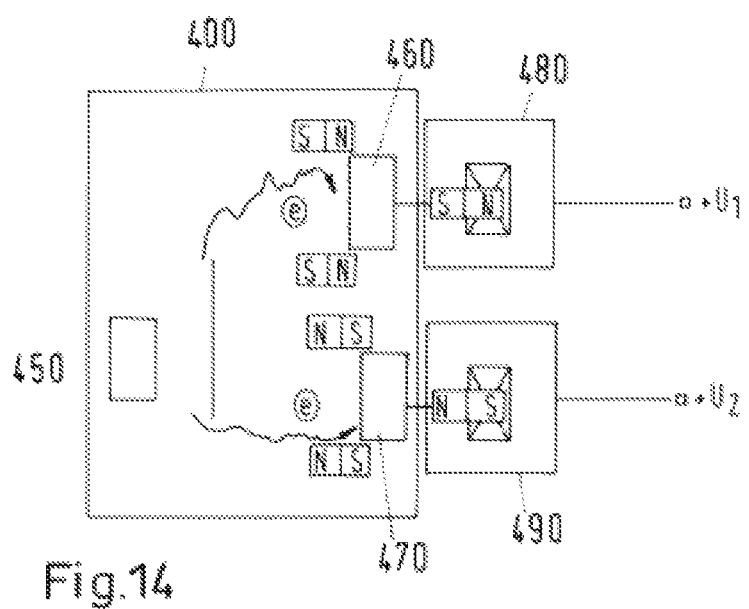
FIG. 14 shows a schematic representation of a vacuum chamber according to the invention for performing a plasma treatment with two rear-side magnets with separate power supplies according to an embodiment.
Figure 17:
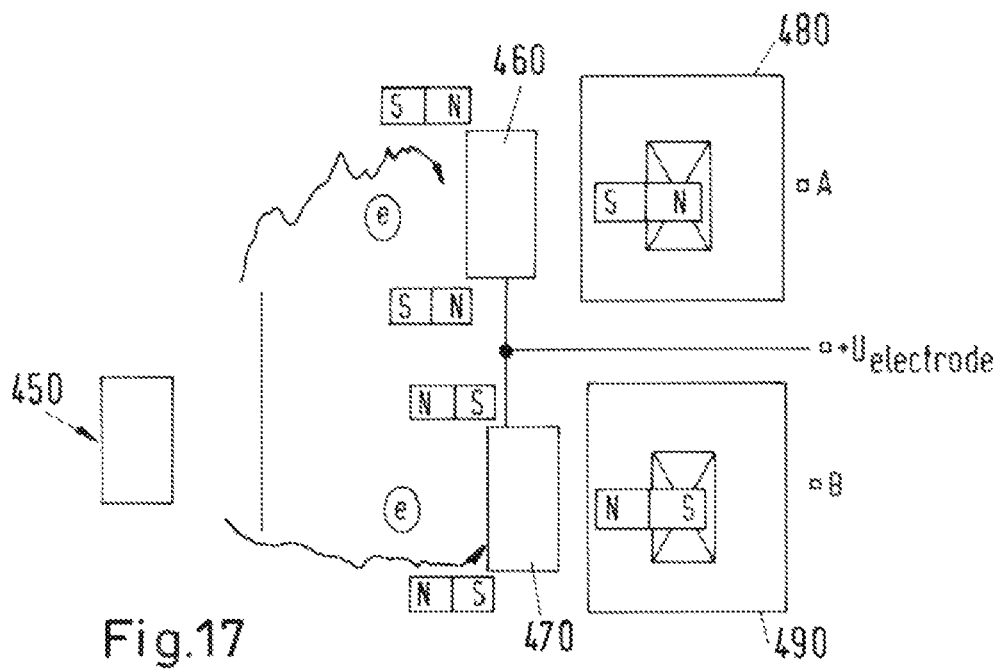
FIG. 17 shows a schematic representation of a magnetic field configuration for two electrodes with front-side and rear-side magnets according to a further embodiment.

FIG. 14 shows an embodiment of a chamber 400 with a similar structure as the embodiment according to FIG. 17. In contrast to FIG. 15, the first electrode and the second electrode of FIG. 14 are connected to different power supplies (power supply U1 and power supply U2). As a result, the polarities of the two coils can be controlled and changed independently of each other, which naturally leads to an improvement in etching homogeneity.

Here, in the vacuum chamber 400 of FIG. 14, a front-side magnet (also magnetic circuit) in each case is arranged at the first electrode 460 and the second electrode 470. Furthermore, a first rear-side magnet 480 is arranged at the first electrode 460 and a second rear-side magnet 490 is arranged at the second electrode 470. As described above, the rear-side magnets 480, 490 are connected to different power supplies (power supply 1 and power supply 2). The front-side magnets are arranged in the vacuum chamber 400 (i.e. under vacuum) while the rear-side magnets 480, 490 are arranged outside the vacuum chamber 400 (i.e. under atmospheric pressure). It is understood that magnets may comprise permanent magnets. As described above, the vacuum chamber according to the invention should comprise a magnet which is arranged to generate a magnetic field at, next to or around the (two-dimensional) working surface of the electrode in or outside the (vacuum) chamber. In this case, the magnet may comprise a front-side magnet and/or a rear-side magnet. Here, in FIG. 15, the front-side magnet 302 is arranged in the area of the working surface 461 for generating a front-side magnetic field, and the rear-side magnet 301 is arranged behind the working surface 461 for generating a rear-side magnetic field. Of course, the front-side magnet can also be arranged at least partially next to the working surface. Both the front-side magnet and the rear-side magnet can be designed as electromagnets, in particular as coils. By using electromagnets, a temporal control of the magnetic field (rear-side or front-side, in particular resulting magnetic field when using rear-side and front-side) is made possible. Here, the magnetic field can be pulsed as well as its strength can be adjusted with substantially the same field direction and also the field direction can be reversed. By changing the direction of the current in the coil, the polarity of the magnetic field can be adjusted. Particularly preferably, when using the vacuum chamber according to the invention, programs can be predetermined in which the current in the coils changes. In this case, for example, a current of 3 A can be used for a first time interval and a current of 3 A with a reversed current direction can be used for a second time interval. The first and second time interval can be the same but of course also different. The currents can also be of different strengths. In summary, the magnetic field generated by the coil can be controlled by the time, the direction and by the current.

Figure 15:
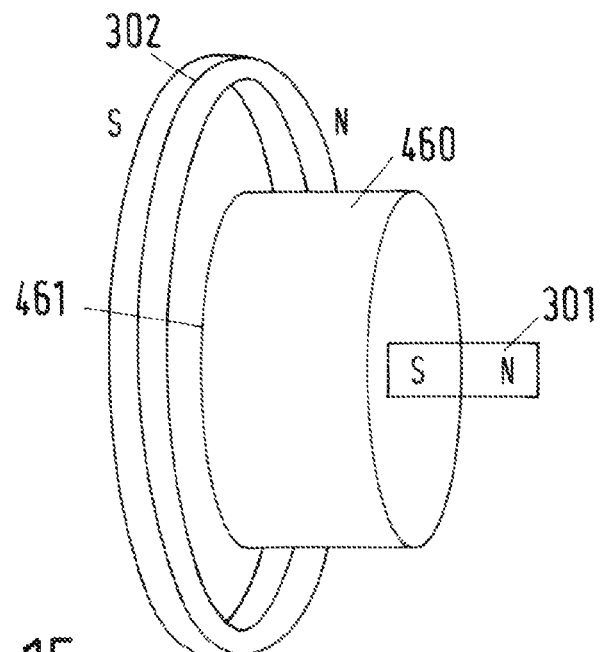
FIG. 15 shows a schematic representation of an electrode arrangement with a front-side and a rear-side magnet according to a further embodiment.
Figure 16:
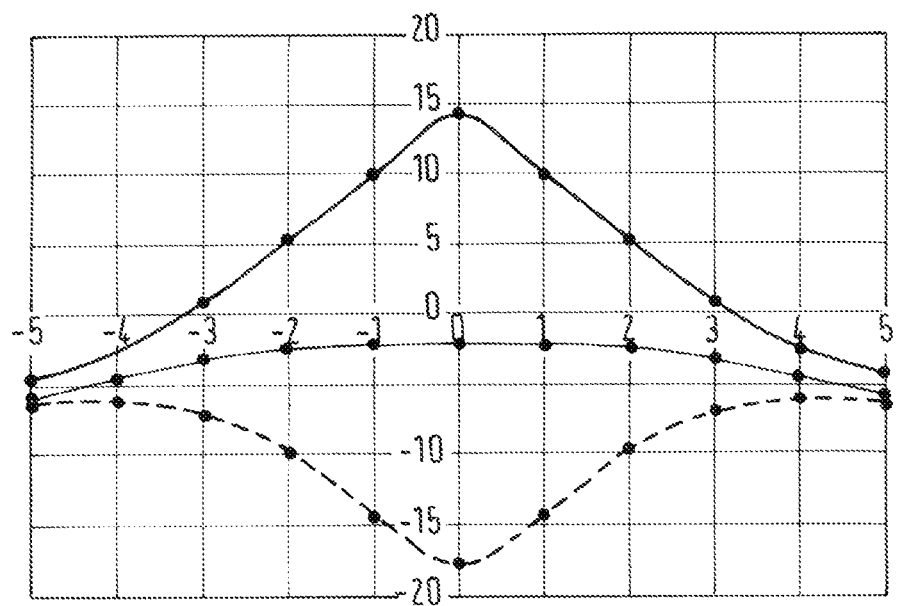
FIG. 16 shows a diagram of magnetic field measurements according to an embodiment.

The system according to the invention may also comprise a plurality of front-side and/or rear-side magnets, i.e., a front-side and/or rear-side magnetic circuit, which are annularly arranged. For example, as shown in FIG. 15, the front-side magnet 302 may be annular or a plurality of front-side magnets 302 may be annularly arranged as a magnetic circuit. For example, the plurality may comprise 20 magnets which are arranged in a particular pattern, wherein each magnet is spaced apart from the other. To generate the front-side magnetic field, a second plurality of permanent magnets may be arranged radially within the first plurality of magnets. The plurality may have an opposite polarity to the second plurality. The rear-side magnet 301 may also be designed as a plurality of magnets which are arranged behind the working surface 461 of the electrode in a predeterminable structure.

The annular front-side magnet 302 according to FIG. 15 has a larger diameter than the round working surface 461 of the electrode 460. In an embodiment of the invention, the diameter of the front-side magnet may be a factor of 1.1 to 2 larger than the diameter of the electrode.

In principle, a magnetization of the magnets should be largely parallel to the surface normal of the working surface 461. For this purpose, the front-side magnets 302 may be arranged in front of, as well as next to and around the working surface 461. It is also possible that a magnetic circuit consists of two magnets, wherein one pole is arranged in front of the working surface and one pole is arranged next to (above or below) the working surface. In particular, the front-side magnets can also be arranged movably so that they can change their position relative to the working surface.

In summary, an arrangement of the magnet (or magnets) is made in such a way that any magnetic field structure (shape and strength) can be generated at the working surface of the two-dimensional electrode. In this regard, it is possible, for example, that the magnetic field strength in the outer area of the working surface is greater than in an inner area of the working surface, but also vice versa.

In general, a magnet according to the invention can be designed at least partially as a permanent magnet, whereby all typical magnet materials such as hard ferrites, AlNiCo, NdFeB, SmCo can be used as volume materials or as plastic-bonded magnets. The magnet can be made of a molded body, or it can be segmented. Typical magnetic field strengths which are preferably used in a vacuum chamber according to the invention have a magnetic field strength of a perpendicular component of the magnetic field on the electrode according to the invention between 0.1 and 100 mT, preferably 1 to 50 mT, in particular 2 to 20 mT.

In any of the recited embodiments, a substrate holder may be arranged in the chamber. The substrate holder preferably comprises a plurality of high-speed steel substrates that are arranged at different heights in the vertical direction. The substrate holder is rotatably arranged in the chamber so that a substrate holder plate can be rotated about a central axis of the substrate holder. In addition, each vertical arrangement of the substrate is rotatable about its individual axis. The first electrode and, if present, the second electrode have, for example, diameters of 100 mm and are arranged in the chamber at predeterminable vertical positions. In order to observe the effects on the individual electrodes and the magnetic fields during an experiment, measurements can be made on the electrodes at three different heights: at 210 mm corresponding to a lower end of the second electrode B; at 340 mm corresponding to 30 mm above a lower end of the first electrode; and 470 mm corresponding to 60 mm above the upper end of the first electrode A. The etched substrates were steel bodies (100Cr6), which were rotated twice in the vacuum chamber.

Now, in FIG. 17, a chamber similar to the one described above is represented, wherein front-side magnetic fields are additionally applied to the electrodes. The front-side magnetic fields of the first electrode 460 (A) and second electrode 470 (B) have opposite polarities. The magnetic fields can be used to adjust the plasma generation in the vicinity of the first and second electrodes 460, 470, which can be achieved by changing the direction of the currents applied to the respective coils. When a current of 80 A is applied to the electrodes, a current of 40 A is applied to the first electrode 460 (A) and a current of 40 A is applied to the second electrode 470 (B). As can be seen, the currents at the first electrode 460 (A) and the second electrode 470 (B) remain close to 40 A when the polarities of the magnetic fields applied to the electrodes 460, 470 are oriented in opposite directions. However, when the applied magnetic fields have the same polarity, the current at the first electrode reaches approximately 80 A, while the current at the second electrode is close to 0 A. This is because the electron current at the second electrode is almost completely shielded in this case.

Figure 18:
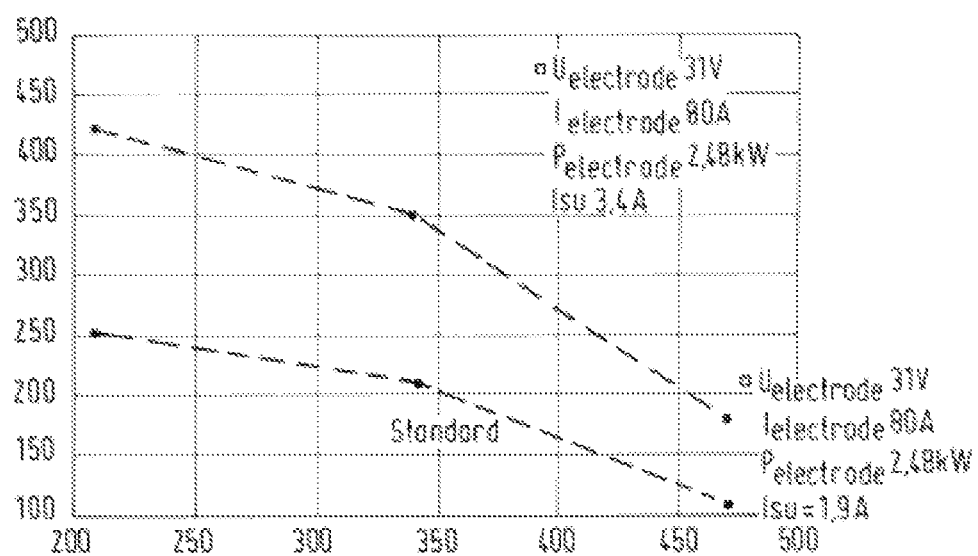
FIG. 18 shows a diagram of an etching depth affected by magnetic fields according to an embodiment.

The diagram and table of FIGS. 18 and 20 show the measurements as taken at the predetermined heights on a device according to 17. A diagram of the results is shown in FIG. 18. The X-axis represents the vertical position above the lower edge of the lower circular electrode B (210 mm), or in other words, the predeterminable height measured in mm, and the Y-axis represents the etching depth in nm. It can be seen from the diagram that the substrates provided at higher vertical positions on the substrate holder show a weaker etching of the substrates than those substrates positioned at lower positions on the substrate holder. The upper line in the diagram shows the embodiment of FIG. 17, while the lower line shows a known system with a linear electrode. According to FIG. 17, in which two single electrodes are operated in parallel, a significantly higher etching rate can be observed due to a higher substrate flow in the chamber. However, the homogeneity is not improved, as can be seen from the decrease in etching depth with decreasing height. FIG. 19, on the other hand, shows an embodiment in which the homogeneity has been improved compared to the state of the art (lower line) by varying the polarity of the magnets over time. The X-axis represents the vertical position above the lower edge of the lower circular electrode B (210 mm), or in other words, the predeterminable height measured in mm, and the Y-axis represents the etching depth in nm.

The first row of the table of FIG. 20, which is labeled "Stand.", shows the measurement made on a known system with a conventional linear electrode. 80 A was applied to the linear electrode and the substrate current was measured at 1.9 A. The etching depth of the bottom measurement (bot, 210 mm) is 250 nm. The depth at the middle measurement (mid, 340 mm) is 210 nm, which is 84% of the bottom etching depth, and the depth at the top measurement point (top, 470 mm) is 110 nm, which is 48% of the bottom etching depth. The described designs with two single electrodes where only rear-side magnetic fields were applied to the electrodes show enhanced etching due to the increased substrate current of 3.4 A, but the same problems with homogeneity remain. A current of 40 A is applied to each electrode. The etching depth for the bottom measurement (bot, 210 mm) is 420 nm. The etching depth at the middle measurement (mid, 340 mm) is 350 nm (83%) and the depth at the top measurement (top, 470 mm) is 180 nm (43%). The next two lines show the results as obtained when magnetic fields are applied to the electrodes. When fields with the same polarity are applied, the current at the first electrode is 75 A and the current at the second electrode is 5 A. The substrate current is high at 4.5 A and etching depth at the top measurement (470 mm) is 760 nm. The middle measurement (340 mm) is 620 nm (86%) and the bottom measurement (340 mm) is 300 nm (39%). When the polarities are changed by reversing the direction of the current applied to the coil, a reverse effect can be observed on the etching depth. The current applied to the first electrode is 49 A and the current applied to the second electrode is 31 A. The substrate current was measured at 4 A. The largest measured depth in this configuration is found at the bottom measurement (210 mm) at 640 nm. The middle measurement (340 mm) gives 490 nm (76%) and the top measurement (470 mm) is 240 nm (38%).

It is desired to achieve a homogeneity in the chamber at which the etching rate is substantially constant over the entire height of the substrate holder. Since the etching profiles show opposite trends from top to bottom at the same polarity of the magnetic field and at the opposite polarity, homogeneity can be achieved by superimposing the etching profiles at specified time intervals. The selected time can be short, such as 1 to 10 revolutions of the substrate holder, or longer if desired. In the example of the configuration according to FIG. 17, it was found that a good homogeneity can be achieved when ⅔ of the process time (e.g. 40 min) is used by applying front-side magnetic fields of the same polarity (as in the third row of the results according to FIG. 20 and upper curve FIG. 19) and ⅓ of the process time (20 min) is used by applying front-side magnetic fields of opposite polarity (as shown in the 4th row of the results in FIG. 20).

While various exemplary configurations have been shown and described within the framework of this application, other embodiments with any number of evaporators and any number of electrodes naturally fall within the scope of protection of the invention claimed herein. Furthermore, an ion etching system according to the invention can be equipped with a plurality of individual electrodes, whereby different electrodes can be supplied with different currents. The same or different currents can be applied to the different electrodes, even at different times, to manipulate the plasma activation and etching as desired.

Although quite a number of embodiments have already been described within the framework of the present application, it goes without saying that further variations are possible. For example, the described embodiments may be suitably combined and supplemented or replaced by equivalent features having the same effect. Accordingly, such other solutions also fall within the scope of protection of the claimed invention.

The invention claimed is:

1. A vacuum chamber for performing a plasma treatment comprising a plasma treatment area which is enclosed by chamber walls, and a plasma source comprising:
   at least one cathode arranged in the vacuum chamber for cathodic vacuum arc evaporation with an arc anode which is connected to the vacuum chamber;
   a shield which can be arranged in front of the cathode;
   at least one electrode arranged in the vacuum chamber, wherein the electrode comprises a working surface for collecting the electrons emitted from the cathode;
   wherein
   the working surface is a two-dimensional surface for collecting the electrons emitted from the cathode, and the two-dimensional surface has a first orthogonal extension and a second orthogonal extension to a surface normal, wherein the first orthogonal extension is perpendicular to the second orthogonal extension and a length ratio of the first orthogonal extension to the second orthogonal extension is between 0.1 and 1,
   at least one magnet for generating a magnetic field which acts on the working surface of the electrode is arranged in, on or in and on the vacuum chamber,
   the at least one magnet comprises a front-side magnet and a rear-side magnet, wherein the front-side magnet is arranged in an area of the working surface for generating a front-side magnetic field and the rear-side magnet is arranged behind the working surface for generating a rear-side magnetic field.

2. The vacuum chamber according to claim 1, wherein the front-side magnet is at least one of:
   arranged in front of the working surface, and
   arranged at least partially next to or around the working surface, and arranged in the vacuum chamber, and
   wherein the rear-side magnet is at least one of arranged in the vacuum chamber and arranged outside the vacuum chamber.

3. The vacuum chamber according to claim 1, wherein the front-side magnet and the rear-side magnet comprises at least one of a permanent magnet and an electromagnet.

4. The vacuum chamber according to claim 1, the at least one electrode comprising a first electrode having a first working surface for collecting the electrons emitted from the at least one cathode and a second electrode having a second working surface for collecting the electrons emitted from at least one of the at least one cathode and a plurality of cathodes.

5. The vacuum chamber according to claim 1, the at least one electrode comprising a plurality of electrodes, wherein the front-side magnet arranged in front of the working surface and the rear-side magnet arranged behind the working surface are arranged on at least one of the plurality of electrodes.

6. The vacuum chamber for performing a plasma treatment comprising a plasma treatment area which is enclosed by chamber walls, and a plasma source comprising:
   at least one cathode arranged in the vacuum chamber for cathodic vacuum arc evaporation with an arc anode which is connected to the vacuum chamber;
   a shield which can be arranged in front of the cathode;
   at least one electrode arranged in the vacuum chamber, wherein the electrode comprises a working surface for collecting the electrons emitted from the cathode;
   wherein
   the working surface is a two-dimensional surface for collecting the electrons emitted from the cathode, and the two-dimensional surface has a first orthogonal extension and a second orthogonal extension to a surface normal, wherein the first orthogonal extension is perpendicular to the second orthogonal extension and a length ratio of the first orthogonal extension to the second orthogonal extension is between 0.1 and 1,
   at least one magnet for generating a magnetic field which acts on the working surface of the electrode is arranged in, on or in and on the vacuum chamber,
   the at least one magnet comprises a front-side magnet and a rear-side magnet, wherein the front-side magnet is arranged in an area of the working surface for generating a front-side magnetic field and the rear-side magnet is arranged behind the working surface for generating a rear-side magnetic field, and the at least one of a front-side magnet and the rear-side magnet is an electromagnet, and
   the vacuum chamber further comprises a current source which is connected to the rear-side magnet and the front-side magnet, wherein the current source is designed in such a way that a current flow to the rear-side magnet and the front-side magnet can be adjusted such that a polarity of the rear-side magnet and the front-side magnet can be reversed.

7. The vacuum chamber according to claim 5, wherein the plurality of electrodes is connected to a common power supply.

8. A vacuum chamber for performing a plasma treatment comprising a plasma treatment area which is enclosed by chamber walls, and a plasma source comprising:
   at least one cathode arranged in the vacuum chamber for cathodic vacuum arc evaporation with an arc anode which is connected to the vacuum chamber;
   a shield which can be arranged in front of the cathode;
   at least one electrode arranged in the vacuum chamber, wherein the electrode comprises a working surface for collecting the electrons emitted from the cathode;
   wherein
   the working surface is a two-dimensional surface for collecting the electrons emitted from the cathode, and the two-dimensional surface has a first orthogonal extension and a second orthogonal extension to a surface normal, wherein the first orthogonal extension is perpendicular to the second orthogonal extension and a length ratio of the first orthogonal extension to the second orthogonal extension is between 0.1 and 1,
   at least one magnet for generating a magnetic field which acts on the working surface of the at least one electrode is arranged in, on or in and on the vacuum chamber,
   the at least one electrode comprising a first electrode having a first working surface for collecting the electrons emitted from the at least one cathode and a second electrode having a second working surface for collecting the electrons emitted from at least one of the at least one cathode and a plurality of cathodes, and
   the at least one magnet comprises a first front-side magnet for generating a front-side magnetic field arranged in an area of the first working surface, and a second rear-side magnet for generating a second rear-side magnetic field arranged behind a second working surface.

9. The vacuum chamber according to claim 1, wherein a magnetic field strength of a perpendicular component on the electrode is between 0.1 and 100 mT.

10. The vacuum chamber according to claim 1, wherein the front-side magnet and the rear-side magnet are designed as electromagnetic coils coupled to the electrode.

11. The vacuum chamber according to claim 1, wherein the front-side magnet and the rear-side magnet are configured as electromagnetic coils coupled to the electrode.

12. The vacuum chamber according to claim 5, wherein the plurality of electrodes comprises a first group of electrodes which is connected to a first power supply and a second group of electrodes which is connected to a second power supply.

13. The vacuum chamber according to claim 8, wherein a first front-side magnet for generating a front-side magnetic field is arranged at least one of in front of, next to and around the first working surface.

14. The vacuum chamber according to claim 9, wherein a magnetic field strength of the perpendicular component on the electrode is 1 to 50 mT.

15. The vacuum chamber according to claim 9, wherein a magnetic field strength of the perpendicular component on the electrode is 2 to 20 mT.

16. The vacuum chamber according to claim 1, wherein the front-side magnet is at least one of:

arranged in front of the working surface, and arranged at least partially next to or around the working surface, and arranged in the vacuum chamber, and wherein the rear-side magnet is at least one of arranged in the vacuum chamber and arranged outside the vacuum chamber.

17. The vacuum chamber according to claim 1, wherein at least one of the front-side magnet or the rear-side magnet comprises at least one of a permanent magnet and an electromagnet.

18. The vacuum chamber according to claim 1, wherein at least one of the front-side magnet or the rear-side magnet is configured as an electromagnetic coil coupled to the electrode.

* * * * *